(12) United States Patent
Kobayashi

(10) Patent No.: US 12,740,276 B2
(45) Date of Patent: Sep. 15, 2026

(54) ELECTRONIC COMPONENT, DISPLAY DEVICE, PHOTOELECTRIC CONVERSION DEVICE, ELECTRONIC APPARATUS, ILLUMINATION DEVICE, AND MOVING BODY

(71) Applicant: CANON KABUSHIKI KAISHA, Tokyo (JP)

(72) Inventor: Kengo Kobayashi, Kanagawa (JP)

(73) Assignee: Canon Kabushiki Kaishi, Tokyo (JP)

( * ) Notice: Subject to any disclaimer, the term of this patent is extended or adjusted under 35 U.S.C. 154(b) by 315 days.

(21) Appl. No.: 18/433,764

(22) Filed: Feb. 6, 2024

(65) Prior Publication Data

US 2024/0276821 A1 Aug. 15, 2024

(30) Foreign Application Priority Data

Feb. 15, 2023 (JP) ................................ 2023-021868
Nov. 21, 2023 (JP) ................................ 2023-197589

(51) Int. Cl.

*H10K 59/19* (2023.01)
*H02S 40/20* (2014.01)
*H05K 5/00* (2025.01)
*H10K 59/80* (2023.01)
*H10K 59/82* (2023.01)
*H10K 77/10* (2023.01)

(52) U.S. Cl.

CPC ............. *H10K 59/19* (2023.02); *H02S 40/20* (2014.12); *H05K 5/0018* (2022.08); *H10K 59/82* (2023.02); *H10K 59/873* (2023.02); *H10K 77/10* (2023.02)

(58) Field of Classification Search

CPC ....... H02S 40/20; H10K 59/873; H10F 77/50; H10F 39/804

See application file for complete search history.

(56) References Cited

U.S. PATENT DOCUMENTS

| | | | | |
|---|---|---|---|---|
| 9,608,029 | B2 * | 3/2017 | Wong | H10F 39/011 |
| 10,986,292 | B2 * | 4/2021 | Mishima | H04N 23/50 |
| 2009/0283887 | A1 * | 11/2009 | Takayama | H10F 77/50 257/680 |
| 2010/0176476 | A1 * | 7/2010 | Takayama | B26D 3/06 83/13 |

FOREIGN PATENT DOCUMENTS

| | | | |
|---|---|---|---|
| JP | 2008-033075 A | | 2/2008 |
| WO | WO2008012460 | * | 1/2008 |

* cited by examiner

*Primary Examiner* — Matthew L Reames
(74) *Attorney, Agent, or Firm* — Venable LLP

(57) ABSTRACT

An electronic component including a first substrate that includes an element region where an element is formed, and a peripheral region which is a region around the element region, a second substrate, which is a substrate arranged so as to face the first substrate, that includes a lower surface facing the element region, a side surface, and a first edge surface provided between the lower surface and the side surface, and a first resin member arranged between the first substrate and the second substrate so as to contact the peripheral region and the first edge surface, wherein the first edge surface includes a contact region in contact with the first resin member, and a non-contact region not in contact with the first resin member.

22 Claims, 19 Drawing Sheets

F I G. 1A
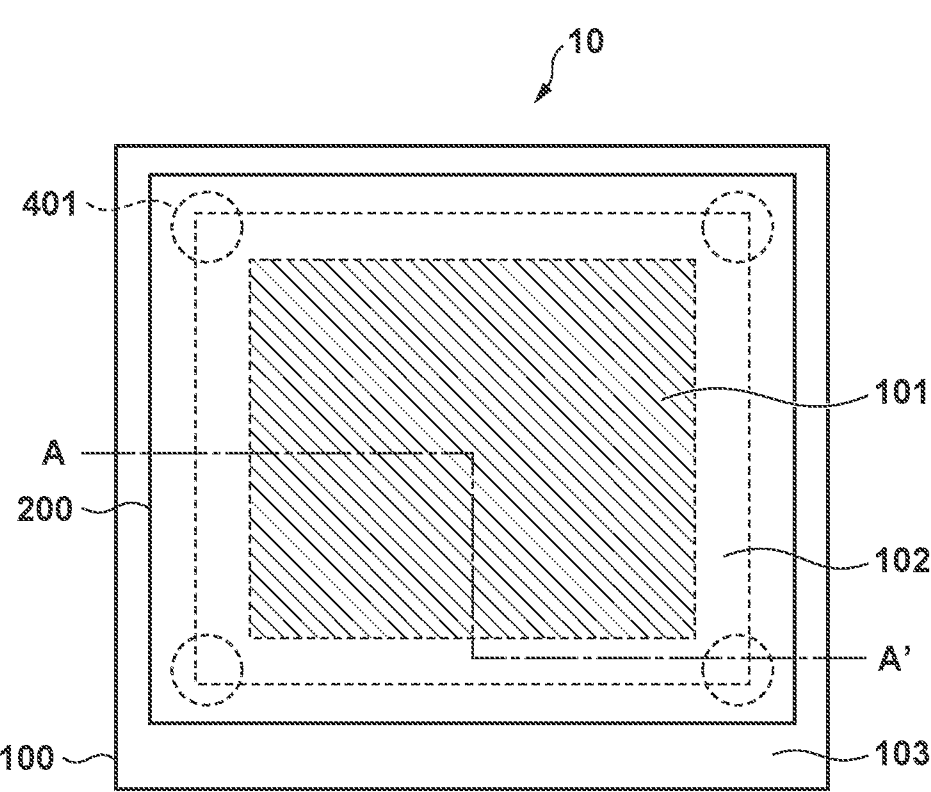
F I G. 1B
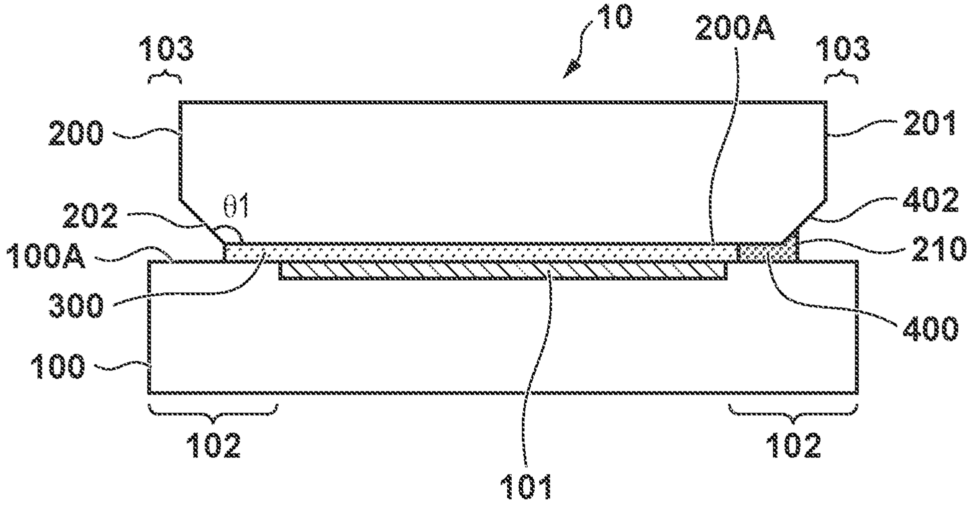

F I G. 4A
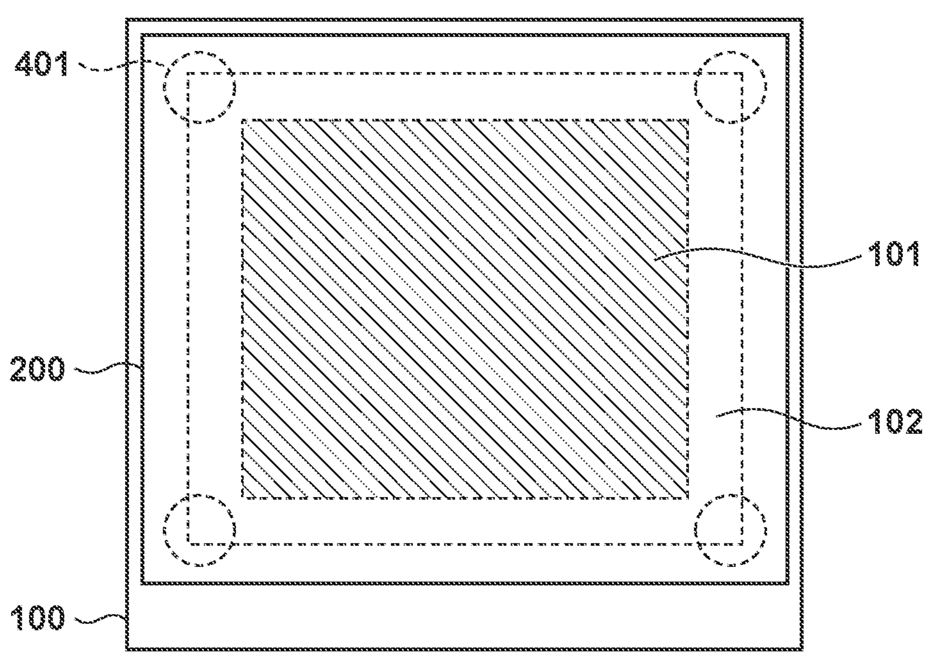
F I G. 4B
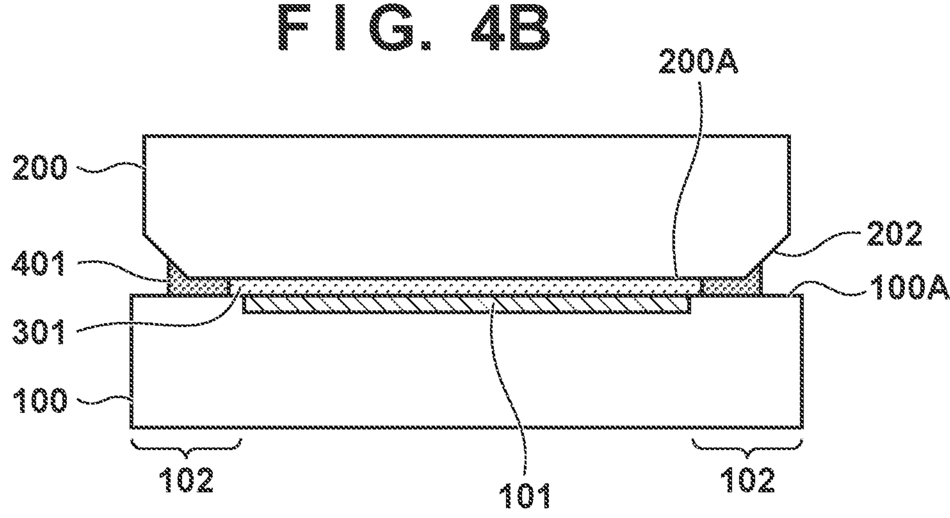

200
202
300
100
101
102

F I G. 12A
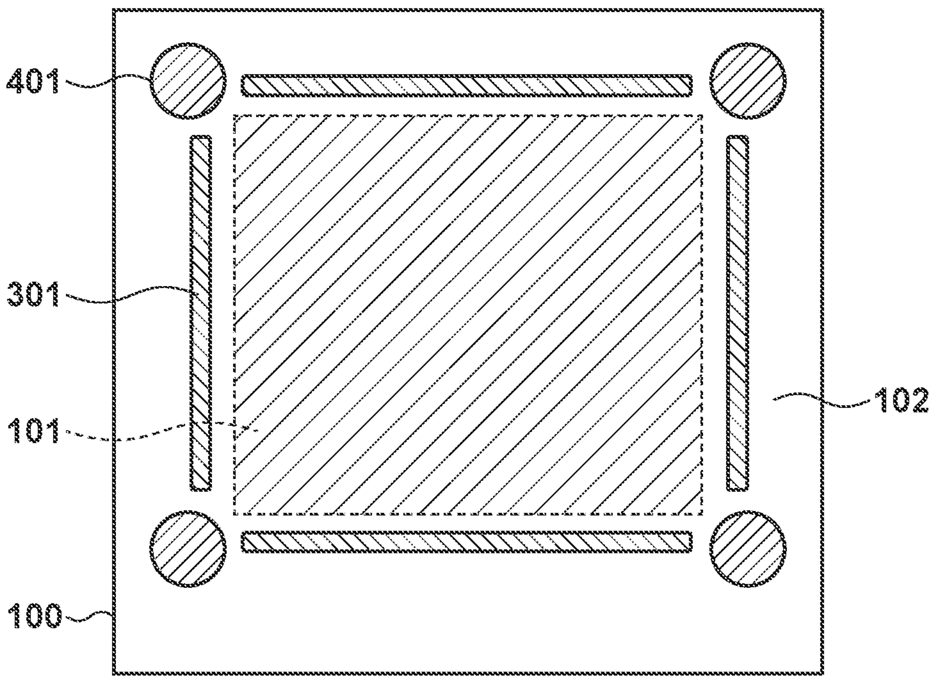
F I G. 12B
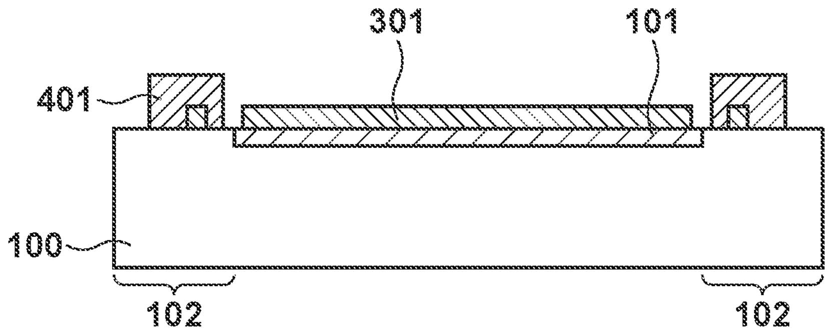
F I G. 13
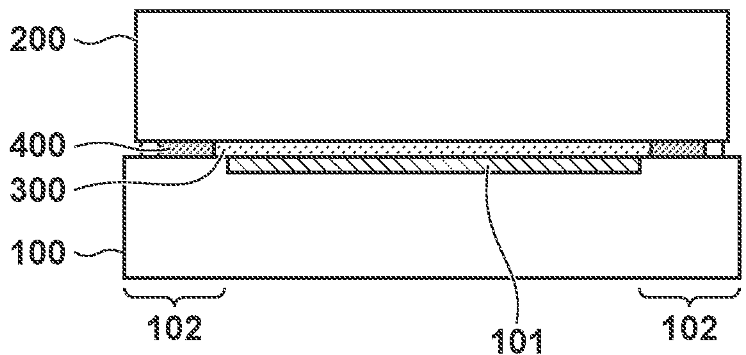

804
845
844
843
842
841
810B
807B
810G
807G
810R
807R
806
805
803
802
801

826
825
823
822
821
820
819
812
811
824
815
814
813
800
817
818
816

F I G. 16
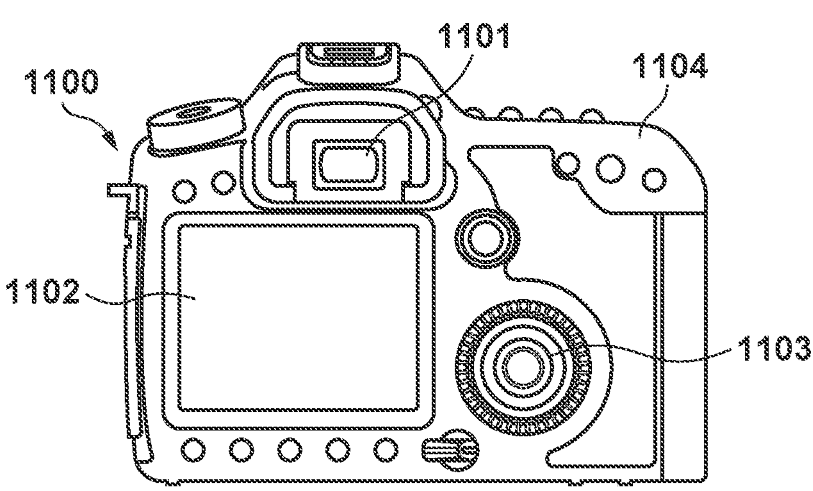
F I G. 17
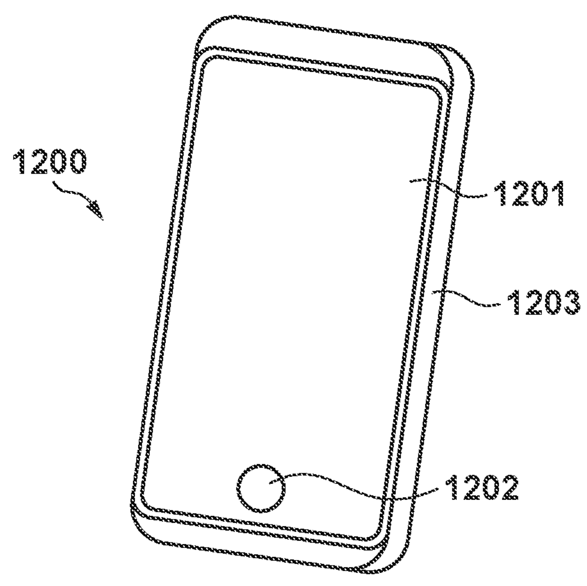

1405
1404
1403
1402
1401
1400

1503
1500

1502
1501

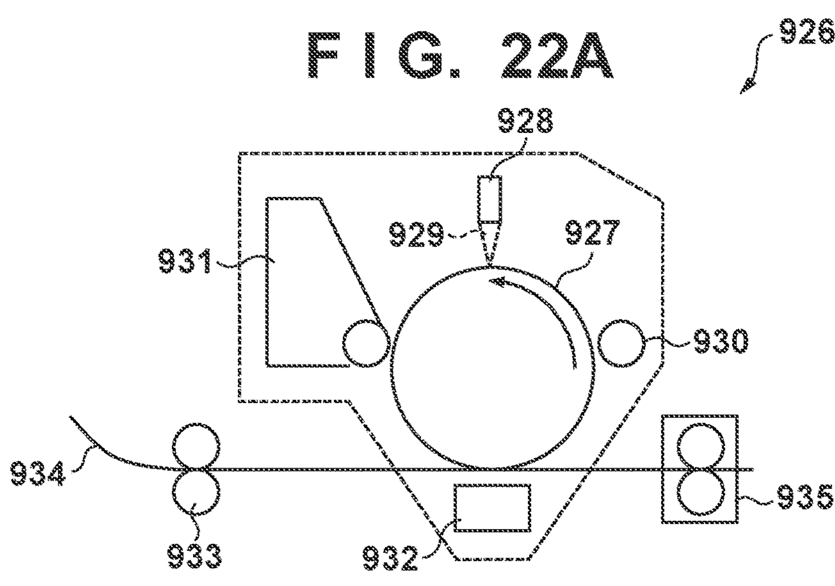
FIG. 22A
FIG. 22B
937
928
936
927
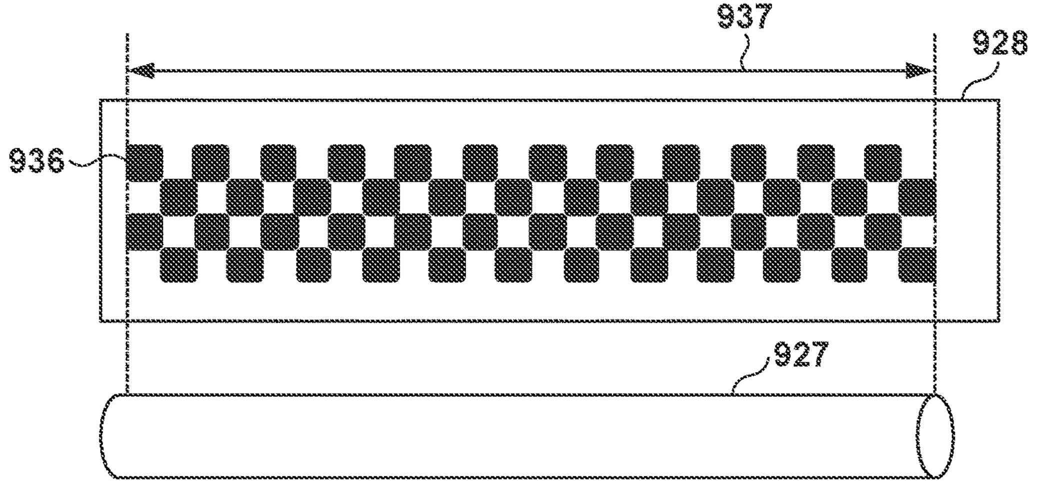
FIG. 22C

ELECTRONIC COMPONENT, DISPLAY DEVICE, PHOTOELECTRIC CONVERSION DEVICE, ELECTRONIC APPARATUS, ILLUMINATION DEVICE, AND MOVING BODY

BACKGROUND OF THE INVENTION

Field of the Invention

The present invention relates to an electronic component, a display device, a photoelectric conversion device, an electronic apparatus, an illumination device, and a moving body.

Description of the Related Art

An electronic component installed in an image capturing device, a display device, or the like is formed by an element substrate with an image sensor or a display element provided therein, a counter substrate that protects the surface of the element substrate, a transparent resin member filled between the element substrate and the counter substrate, and a resin member for holding the counter substrate. The element substrate includes an element region where an element such as the image sensor or the display element is formed, and a peripheral region provided on the outer edge side of the element region.

In such the electronic component, in order to downsize the element substrate, it is demanded to make the peripheral region in the element substrate as small as possible. However, as the peripheral region is reduced, the peripheral region facing the counter substrate decreases, resulting in a reduction of the arrangement area where the resin member can be arranged. If the arrangement area is reduced, the bonding area between the resin member and the counter substrate decreases. In this case, the force for holding the counter substrate by the resin member decreases, so that the position of the counter substrate may be shifted, and the reliability of the electronic component may decrease.

To prevent this, Japanese Patent Laid-Open No. 2008-033075 discloses a technique of applying (arranging) the resin member in a dot in each of four corners of the counter substrate. In the technique disclosed in Japanese Patent Laid-Open No. 2008-033075, the resin member arranged in each of four corners of the counter substrate holds the counter substrate from side surfaces, so that a positional shift of the counter substrate can be prevented.

However, if downsizing of the element substrate further progresses, holding the counter substrate from side surfaces by the resin member arranged in each of four corners of the counter substrate will be insufficient for preventing a positional shift of the counter substrate.

In addition, it is difficult to accurately control the amount of the resin member protruding from the counter substrate. In a case of the reduced peripheral region in the element substrate, if the amount of the resin member is increased, the resin member protrudes from the element substrate, and this can cause a degradation in quality in a subsequent step.

SUMMARY OF THE INVENTION

The present invention provides a technique advantageous in, in an electronic component including a first substrate and a second substrate facing the first substrate, suppressing a positional shift of the second substrate with respect to the first substrate and downsizing the electronic component.

According to one aspect of the present invention, there is provided an electronic component including a first substrate that includes an element region where an element is formed, and a peripheral region which is a region around the element region, a second substrate, which is a substrate arranged so as to face the first substrate, that includes a lower surface facing the element region, a side surface, and a first edge surface provided between the lower surface and the side surface, and a first resin member arranged between the first substrate and the second substrate so as to contact the peripheral region and the first edge surface, wherein the first edge surface includes a contact region in contact with the first resin member, and a non-contact region not in contact with the first resin member.

Further aspects of the present invention will become apparent from the following description of exemplary embodiments with reference to the attached drawings.

BRIEF DESCRIPTION OF THE DRAWINGS

FIGS. 1A and 1B are views schematically showing the structure of an electronic component in the first embodiment of the present invention.

FIGS. 4A and 4B are views for explaining the method of manufacturing the electronic component shown in FIGS. 1A and 1B.

FIGS. 12A and 12B are views for explaining a method of manufacturing the electronic component shown in FIGS. 11A and 11B.

FIG. 13 is a view schematically showing the structure of an electronic component in a related art.

FIG. 16 is a view showing an example of a photoelectric conversion device using the electronic component in the embodiment.

FIG. 17 is a view showing an example of an electronic apparatus using the electronic component in the embodiment.

FIGS. 22A to 22C are views showing an example of an image forming device using the electronic component in the embodiment.

DESCRIPTION OF THE EMBODIMENTS

Figure 2A:
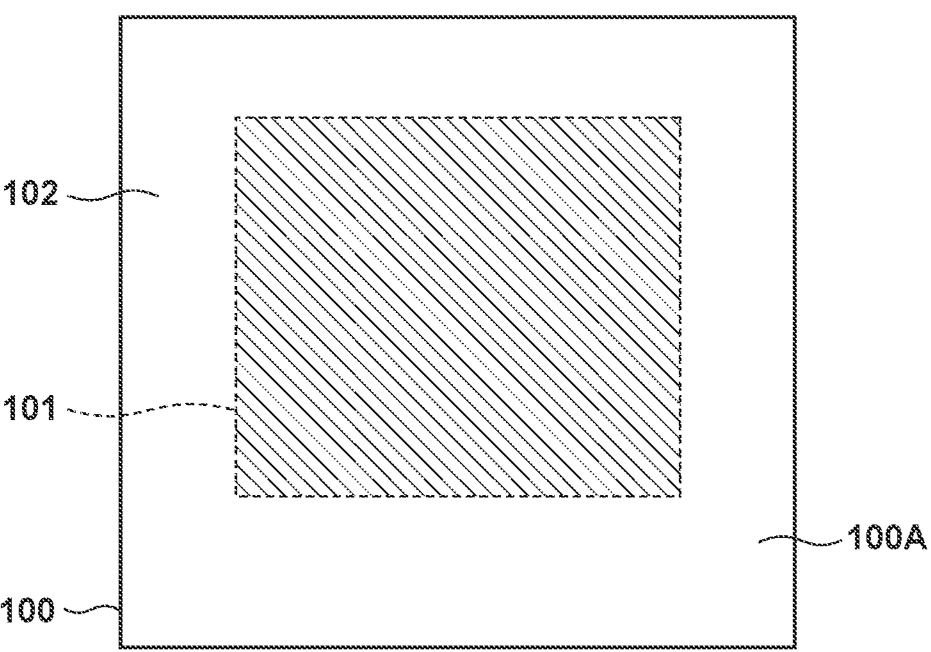
FIGS. 2A and 2B are views for explaining a method of manufacturing the electronic component shown in FIGS. 1A and 1B.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

With reference to FIGS. 1A and 1B, an electronic component 10 in the first embodiment of the present invention will be described. FIGS. 1A and 1B are views schematically showing the structure of the electronic component 10. FIG. 1A shows a plan view of the electronic component 10, and FIG. 1B shows a sectional view of the electronic component 10 shown in FIG. 1A taken along a line A-A'.

The electronic component 10 includes, for example, various kinds of electronic devices such as an Organic Light Emitting Diode (OLED) and a CMOS sensor. As shown in FIGS. 1A and 1B, the electronic component 10 includes a first substrate 100, a second substrate 200, a first resin member 300, and a second resin member 400.

The first substrate 100 is a substrate (element substrate) having, for example, a rectangular shape and made of silicon, glass, or the like. The first substrate 100 includes, in a main surface 100A (the upper surface on the upper side in FIG. 1B), an element region 101 where an electronic element is arranged (formed), and a peripheral region 102 which is a region around the element region 101.

The second substrate 200 is a substrate (counter substrate) arranged so as to face the main surface 100A of the first substrate 100. The second substrate 200 is bonded to the first substrate 100 via the first resin member 300. The second substrate 200 is a translucent substrate having, for example, a rectangular shape and made of glass or the like. In order to protect the element region 101 of the first substrate 100, the second substrate 200 is arranged so as to cover the element region 101 of the first substrate 100 without protruding from the outer periphery of the first substrate 100. In this embodiment, the first substrate 100 includes a non-overlapping region 103 where the first substrate 100 does not overlap the second substrate 200 in a planar view. However, the first substrate 100 may not include the non-overlapping region 103.

The second substrate 200 includes a main surface 200A (the lower surface on the lower side in FIG. 1B) facing the element region 101 of the first substrate 100, a side surface 201, and a first edge surface 202 provided between the main surface 200A and the side surface 201. The first edge surface 202 is provided over the entire circumference of the outer peripheral region (outer periphery portion) of the second substrate 200. The first edge surface 202 is provided so as to overlap the peripheral region 102 in an orthogonal projection with respect to the peripheral region 102 outside the element region 101 of the first substrate 100. The first edge surface 202 is formed as, for example, a chamfered portion. The angle of the first edge surface 202 with respect to the main surface 200A (the inner angle of a structure including the first edge surface 202 and the main surface 200A) is an obtuse angle. In other words, an intersection angle θ1 between the main surface 200A and the first edge surface 202 of the second substrate 200 is formed to be an obtuse angle. The first edge surface 202 suppresses that the ridge line of the main surface 200A of the second substrate 200 is chipped due to contact with a transfer collet or a transfer stage during conveyance of the second substrate 200 in an assembly step. Further, the first edge surface 202 suppresses that the element region 101 of the first substrate 100 is damaged when bonding the second substrate 200 to the first substrate 100.

Each of the first resin member 300 and the second resin member 400 is made of a transparent epoxy resin or acrylic resin, and a UV-curable resin, a thermosetting resin, a two-liquid mixed resin, or the like is used. Each of the first resin member 300 and the second resin member 400 is a liquid resin material in a state before undergoing a process such as UV irradiation, annealing, or time elapse.

The first resin member 300 is filled (arranged) between the first substrate 100 and the second substrate 200. The first resin member 300 is arranged so as not to protrude from the outer periphery (outer shape) of the first substrate 100, and contacts the first edge surface 202 of the second substrate 200. Note that in this embodiment, as shown in FIG. 1B, the entire surface of the first resin member 300 contacts the main surface 100A of the first substrate 100 and the main surface 200A of the second substrate 200 between them, but the present invention is not limited to this. For example, the first resin member 300 may contact each of the main surface 100A of the first substrate 100 and the main surface 200A of the second substrate 200 only in each of four corners, and need not contact them over the entire surface.

The second resin member 400 is arranged between the peripheral region 102 of the first substrate 100 and the main surface 200A of the second substrate 200 so as to contact them, and contacts the first edge surface 202. The second resin member 400 is provided at each of a plurality of portions spaced apart from each other. For example, in order to prevent the second substrate 200 from shifting during conveyance, the second resin member 400 is arranged in each of four corners of the second substrate 200 so as to contact the first edge surface 202 provided in each side (all sides) forming the outer periphery of the second substrate 200. The shape of the second resin member 400, when viewed from above, arranged at each portion in the second substrate 200 is not limited to a circular shape as shown in FIG. 1A, but may be an oval shape, a square shape, or a rectangular shape. In order to prevent protrusion from the outer periphery of the first edge surface 202 of the second substrate 200, the second resin member 400 is arranged so as not to contact the entire surface of the first edge surface 202. In other words, the first edge surface 202 of the second substrate 200 includes a contact region 210 in contact with the second resin member 400, and a non-contact region 402 not in contact with the second resin member 400. Note that the non-contact region 402 is located between the contact region 210 and the side surface 201.

In this manner, when the second resin member 400 contacts the first edge surface 202 provided in the second substrate 200, the force for holding the second substrate 200 by the second resin member 400 can be improved. Accordingly, the bonding force (bonding strength) of the second substrate 200 with respect to the first substrate 100 improves, so that it is possible to suppress a positional shift of the second substrate 200 with respect to the first substrate 100 and downsize the electronic component 10 (size thereof).

With reference to FIGS. 2A to 4B, a method of manufacturing the electronic component 10 will be described. Each of FIGS. 2A, 3A, and 4A shows a plan view of the electronic component 10 (constituent members thereof), and each of FIGS. 2B, 3B, and 4B shows a sectional view of the electronic component 10 (constituent members thereof).

Figure 2B:
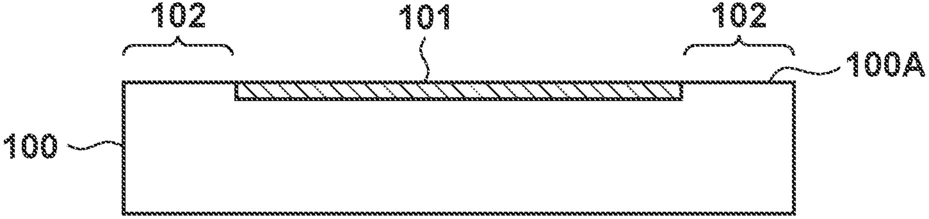

In the first step, as shown in FIGS. 2A and 2B, the first substrate 100 including (in the main surface 100A) the element region 101 and the peripheral region 102 which is a region around the element region 101 is prepared. In the element region 101 of the first substrate 100, an electronic element (not shown) and a semiconductor element (not shown) and a wiring layer (not shown) for controlling the electronic element are arranged (formed).

Figure 3A:
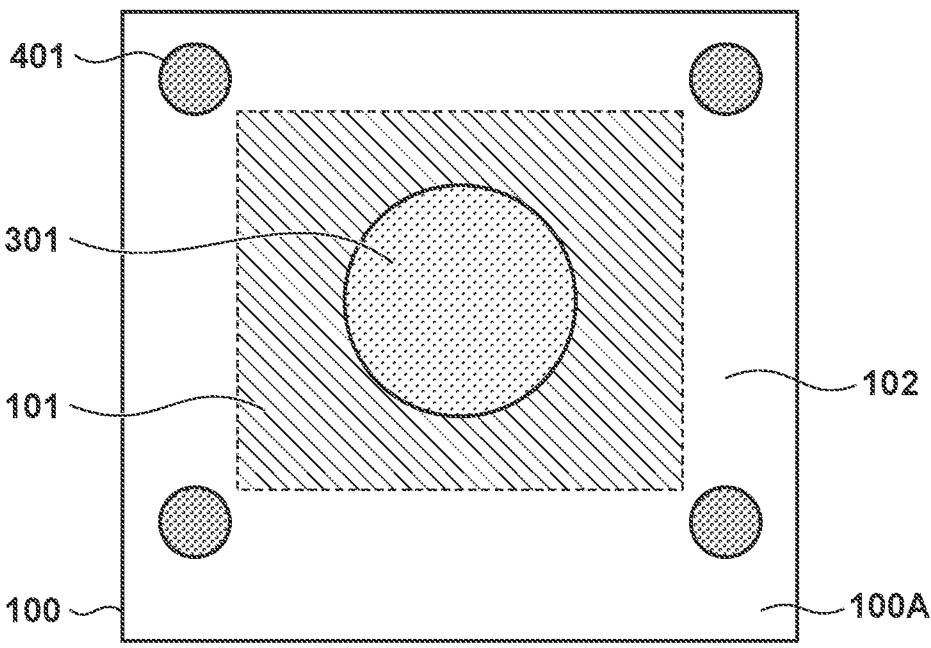
FIGS. 3A and 3B are views for explaining the method of manufacturing the electronic component shown in FIGS. 1A and 1B.
Figure 3B:
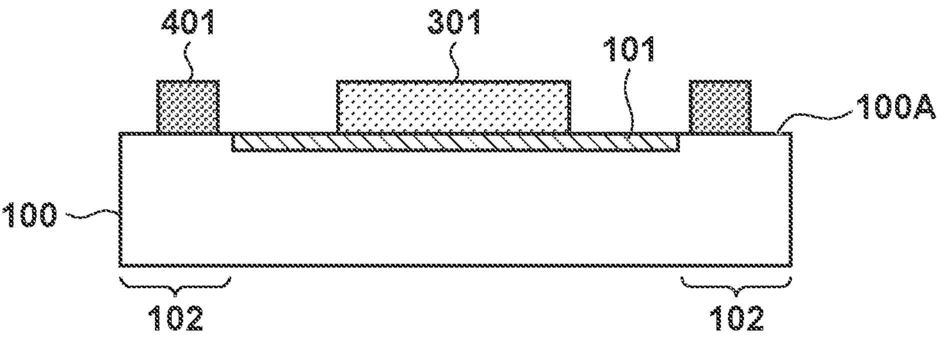

Then, in the second step, as shown in FIGS. 3A and 3B, a second resin material 401 in a liquid state to be the second resin member 400 is arranged on the peripheral region 102 of the first substrate 100. Further, in the second step, a first resin material 301 in a liquid state to be the first resin member 300 is arranged on the element region 101 of the first substrate 100. For the first substrate 100, it is preferable to arrange the second resin material 401 in the liquid state and the first resin material 301 in the liquid state in this order. However, the first resin material 301 in the liquid state and the second resin material 401 in the liquid state may be arranged in this order. At this point of time, the second resin material 401 in the liquid state to be the second resin member 400 and the first resin material 301 in the liquid state to be the first resin member 300 are spaced apart from each other.

In this embodiment, as shown in FIGS. 3A and 3B, the second resin material 401 is arranged at each of four portions in the peripheral region 102 outside the element region 101 of the first substrate 100, but the present invention is not limited to this. The second resin material 401 is only required to be arranged at one or more portions with respect to each side forming the outer periphery of the first substrate 100, and preferably arranged at each of positions spaced apart from each other. The first resin material 301 is arranged in the central portion of the element region 101 of the first substrate 100 in the amount calculated from the gap between the first substrate 100 and the second substrate 200, the area of the element region 101, and the area of the second substrate 200. In this embodiment, the size of the second substrate 200 is 15 mm×20 mm, and the gap between the first substrate 100 and the second substrate 200 is 0.03 mm. In this case, the first resin material 301 of 9 $mm^3$ is required. When the diameter of the second resin member 400 viewed from above is 1 mm, the second resin material 401 of 0.0236 $mm^3$ per portion is required.

Then, in the third step, as shown in FIGS. 4A and 4B, the second substrate 200 is arranged so as to face the first substrate 100. More specifically, the second substrate 200 is arranged with respect to the first substrate 100 such that the second substrate 200 contacts the first resin material 301 in the liquid state on the element region 101 of the first substrate 100 and the second resin material 401 in the liquid state on the peripheral region 102 of the first substrate 100. Then, the first resin material 301 in the liquid state is made to flow between the first substrate 100 and the second substrate 200 to make the first resin material 301 in the liquid state contact the second resin material 401 in the liquid state. In this manner, when the first resin material 301 to be the first resin member 300 is pressed by the second substrate 200 and made to flow while spreading along the main surface 200A of the second substrate 200, the first substrate 100 and the second substrate 200 are bonded. In order to prevent the second resin material 401 from being swept away by the first resin material 301 flowing along the main surface 200A of the second substrate 200, the second resin material 401 preferably has a higher viscosity than the first resin material 301. When the second resin material 401 is pressed by the second substrate 200 and made to flow while spreading along the main surface 200A of the second substrate 200, it comes into contact with the first edge surface 202 of the second substrate 200. The first resin material 301 to be the first resin member 300 may or may not protrude from the outer periphery of the second substrate 200 as long as it does not protrude from between the first substrate 100 and the second substrate 200 to the outer periphery of the first substrate 100. Note that the first resin material 301 preferably covers the entire surface of the element region 101 of the first substrate 100. Further, in order to prevent the first resin material 301 to be the first resin member 300 from entering between the second resin member 400 and the second substrate 200, the bonding speed of the first substrate 100 and the second substrate 200 or the like is appropriately adjusted. The gap between the first substrate 100 and the second substrate 200 is controlled by mechanically moving the respective positions of the first substrate 100 and the second substrate 200.

Further, in the third step, after the first substrate 100 and the second substrate 200 are bonded, the second resin material 401 is cured by a curing method such as UV curing, heat curing, or time elapse after mixture of the two liquids in accordance with the second resin material 401 to be the second resin member 400. Owing to the second resin material 401 cured between the first substrate 100 and the second substrate 200, the first substrate 100 and the second substrate 200 are conveyed to the next step while being bonded and fixed to each other. In the next step, the first resin material 301 is cured by a curing method such as UV curing, heat curing, or time elapse after mixture of the two liquids in accordance with the first resin material 301 to be the first resin member 300. In this manner, as shown in FIGS. 4A and 4B, the second substrate 200 is bonded to the first substrate 100 via the first resin member 300.

Second Embodiment

Figure 5A:
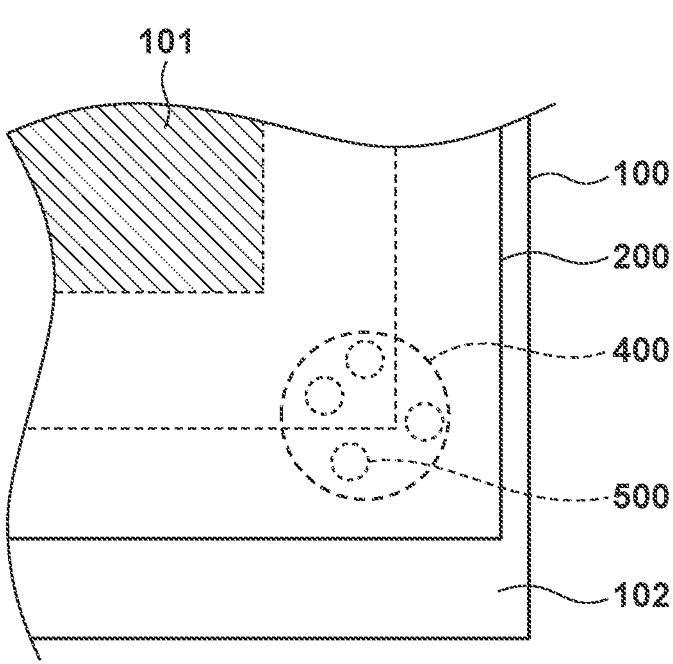
FIGS. 5A and 5B are enlarged views schematically showing a part of the structure of an electronic component in the second embodiment of the present invention.
Figure 5B:
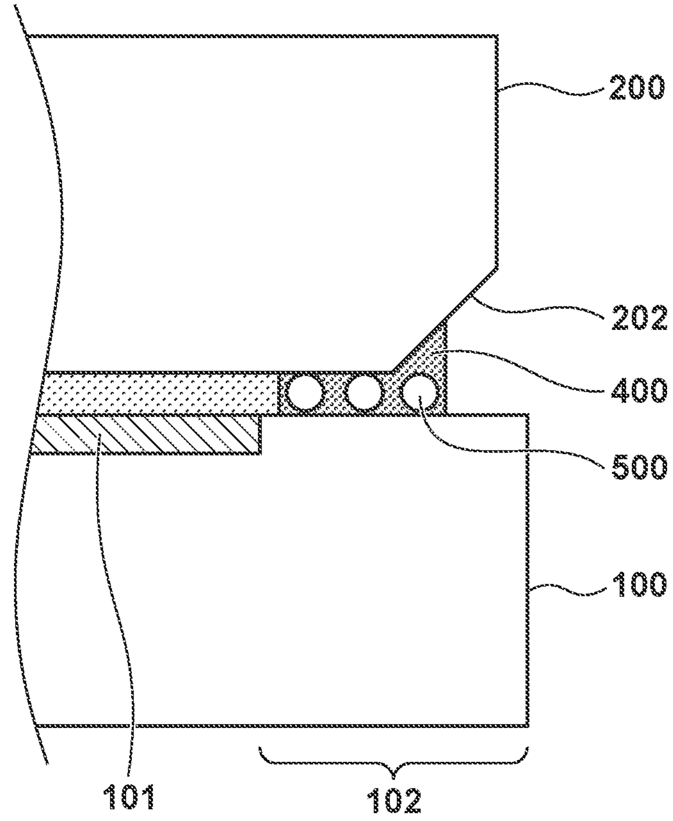

With reference to FIGS. 5A and 5B, an electronic component 10 in the second embodiment of the present invention will be described. FIGS. 5A and 5B are enlarged views schematically showing a part (around a second resin member 400) of the structure of the electronic component 10. FIG. 5A shows a plan view of the electronic component 10, and FIG. 5B shows a sectional view of the electronic component 10 shown in FIG. 5A. Note that a detailed description of components of the electronic component 10 similar to those in the first embodiment will be omitted.

The electronic component 10 in this embodiment is different from that in the first embodiment in that it includes a spacer 500 arranged between a first substrate 100 and a second substrate 200. The spacer 500 is covered with a second resin member 400. In other words, and the second resin member 400 incorporates the spacer 500.

The spacer 500 is a member set to bring the gap between the first substrate 100 and the second substrate 200 to a desired gap, and generally formed by a spherical member. The spacer 500 is made of a resin, ceramic, glass, or the like. The second resin member 400 at each portion incorporates (is mixed with) at least one or more spacers 500. As shown in FIGS. 5A and 5B, the spacer 500 contacts each of a peripheral region 102 of the first substrate 100 and a main surface 200A of the second substrate 200, so that the gap between the first substrate 100 and the second substrate 200 can be accurately managed (controlled).

Figure 6A:
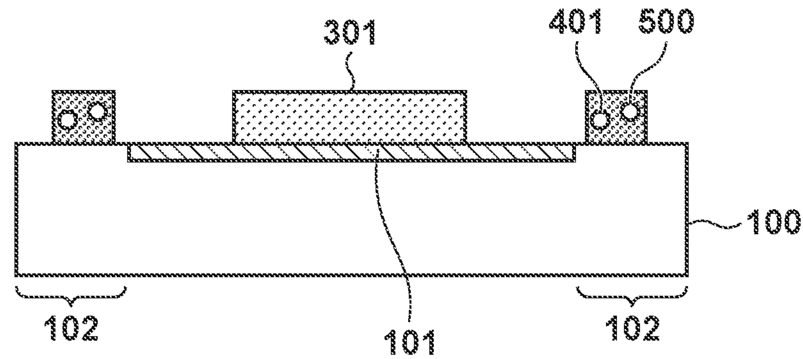
FIGS. 6A and 6B are views for explaining a method of manufacturing the electronic component shown in FIGS. 5A and 5B.
Figure 6B:
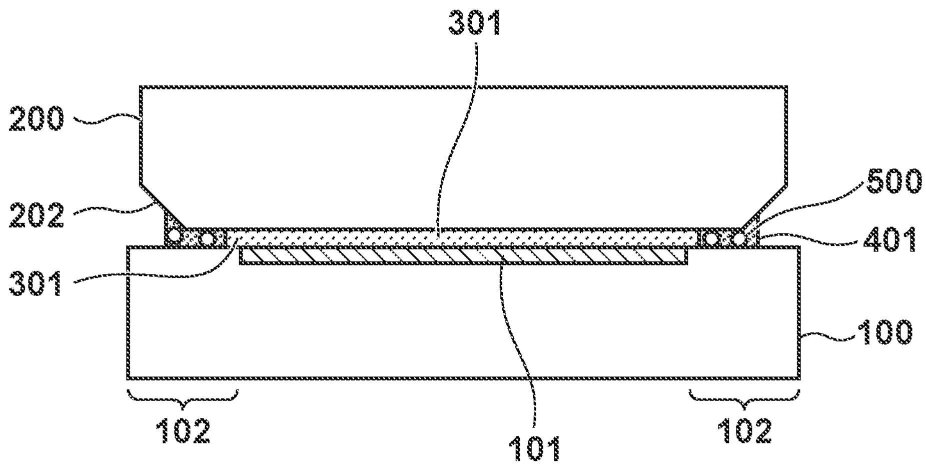

With reference to FIGS. 6A and 6B, a method of manufacturing the electronic component 10 shown in FIGS. 5A and 5B will be described. FIG. 6A shows a plan view of the electronic component 10 (constituent members thereof), and FIG. 6B shows a sectional view of the electronic component 10 (constituent members thereof).

In the first step, as shown in FIG. 6A, the first substrate 100 is placed such that an element region 101 faces upward, and a second resin material 401 in a liquid state, which is to be the second resin member 400, mixed with the spacer 500 is arranged on the peripheral region 102 of the first substrate 100. Further, a first resin material 301 in a liquid state to be the first resin member 300 is arranged on the element region 101 of the first substrate 100.

In the second step, as shown in FIG. 6B, the first substrate 100 and the second substrate 200 are bonded. More specifically, after moving the second substrate 200 above the first substrate 100, the second substrate 200 is moved until it comes into contact with the spacer 500 by own weight of the second substrate 200 or by applying a controlled force. In the first embodiment, the gap between the first substrate 100 and the second substrate 200 is controlled by mechanically moving the respective positions of the first substrate 100 and the second substrate 200. However, in this embodiment, the gap is controlled by the spacer 500. In a state after arranging the first resin material 301 in the liquid state to be the first resin member 300 and before bonding the second substrate 200, the second resin material 401 to be the second resin member 400 is a liquid incorporating the spherical spacer 500. Therefore, the gap between the first substrate 100 and the second substrate 200 can be controlled by the spacer 500.

Then, in the third step, after bonding the first substrate 100 and the second substrate 200, the first resin material 301 and the second resin material 401 are cured. The first resin material 301 in the liquid state and the second resin material 401 in the liquid state are cured in accordance with the curing method of the first resin material 301 to be the first resin member 300 and the curing method of the second resin material 401 to be the second resin member 400, respectively. With this, the first resin member 300 in a solid state is formed on the element region 101 of the first substrate 100, and the second resin member 400 in a solid state is formed on the peripheral region 102 of the first substrate 100. Note that the spacer 500 is only required to contact the peripheral region 102 of the first substrate 100 and the main surface 200A of the second substrate 200, and may or may not be incorporated between the peripheral region 102 of the first substrate 100 and a first edge surface 202 of the second substrate 200.

Third Embodiment

Figure 7A:
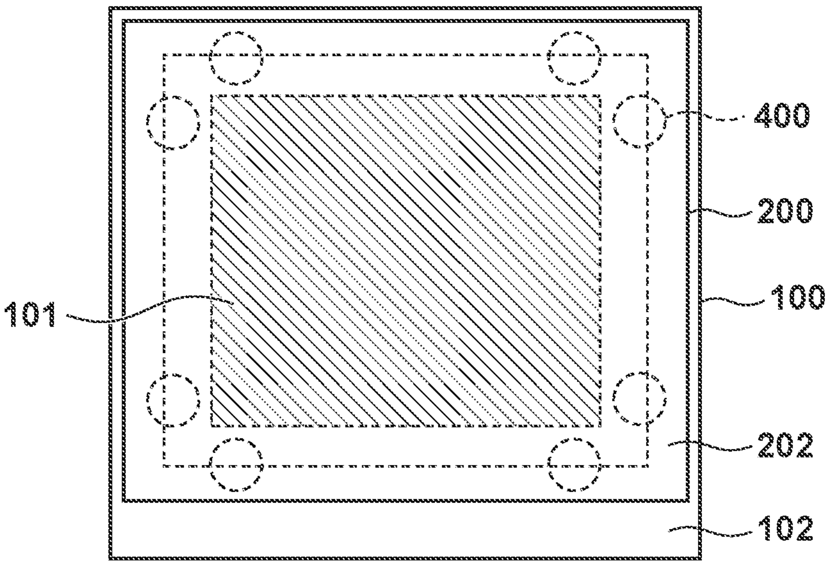
FIGS. 7A to 7C are views each schematically showing the structure of an electronic component in the third embodiment of the present invention.
Figure 7B:
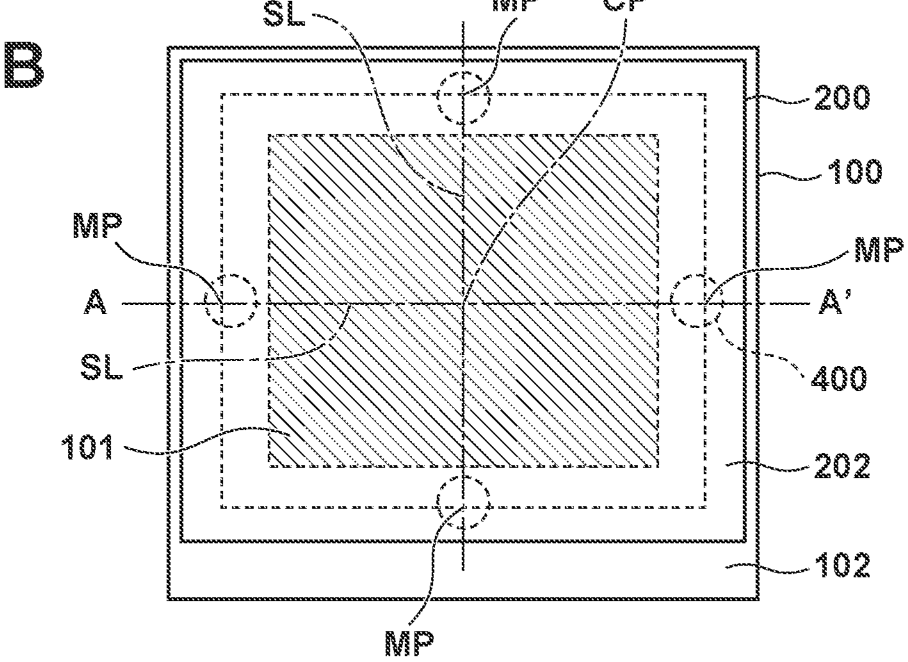
Figure 7C:
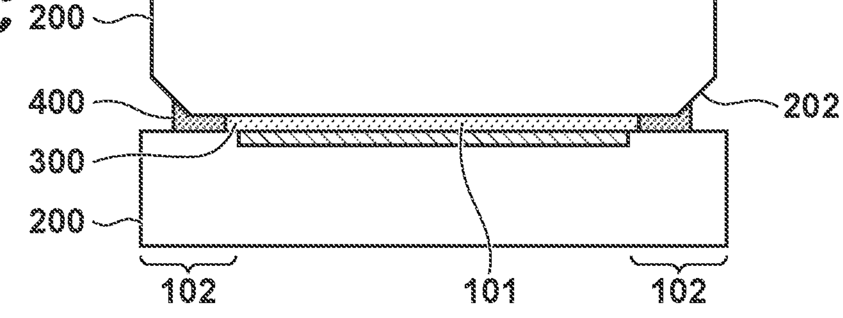
Figure 8:
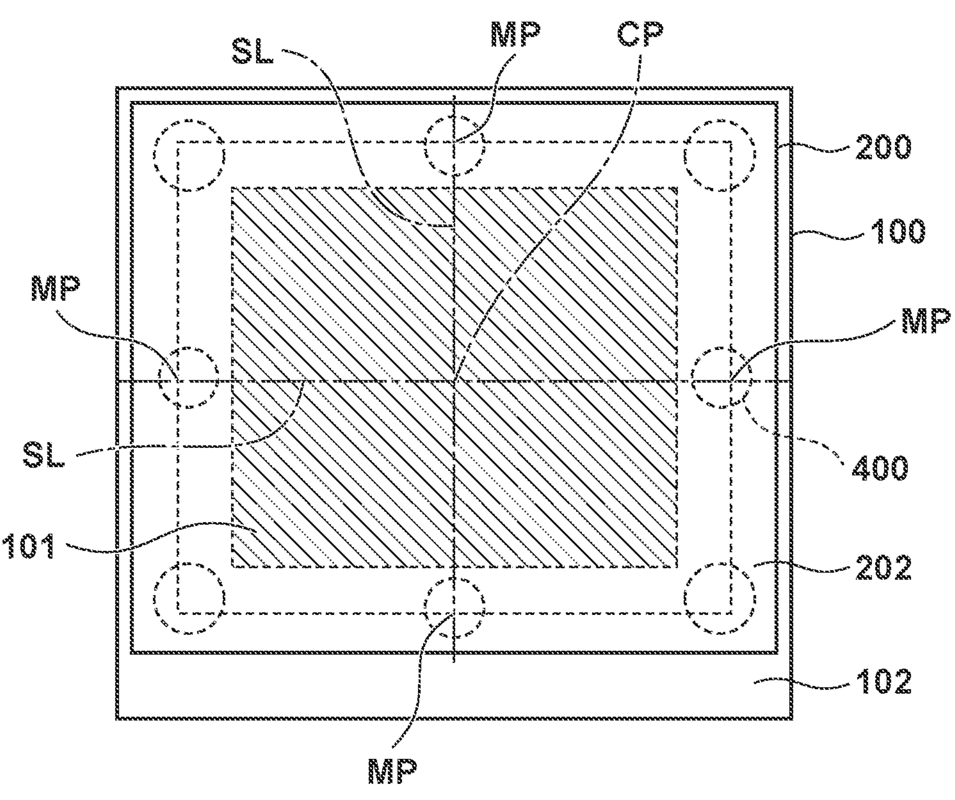
FIG. 8 is a view schematically showing the structure of the electronic component in the third embodiment of the present invention.

With reference to FIGS. 7A to 8, an electronic component 10 in the third embodiment of the present invention will be described. FIGS. 7A to 8 are views each schematically showing the structure of the electronic component 10. Each of FIGS. 7A, 7B, and 8 shows a plan view of the electronic component 10, and FIG. 7C shows a sectional view of the electronic component 10 shown in FIG. 7B taken along a line A-A'.

The electronic component 10 in this embodiment is different from that in the first embodiment in each of the positions (portions) to arrange a second resin member 400.

For example, as shown in FIG. 7A, in each of four corners of a second substrate 200, the second resin member 400 is arranged at each of two or more portions so as to contact a first edge surface 202 provided in each side forming the outer periphery of the second substrate 200. More specifically, the second resin member 400 is arranged at each of two portions near each of four corners of the second substrate 200 so as to sandwich each of four corners of the second substrate 200. With this, the second resin member 400 can more firmly hold the second substrate 200. As a result, even if a peripheral region 102 of a first substrate 100 is reduced, a positional shift of the second substrate 200 can be prevented.

Alternatively, as shown in FIGS. 7B and 7C, the second resin member 400 may be arranged at one or more portions on each straight line SL (at least one portion on the straight line) connecting a center CP of the second substrate 200 (first substrate 100) and a middle point MP of each side of the second substrate 200. With this, the amount of a first resin member 300 protruding from the outer periphery of the second substrate 200 can be controlled, so that protrusion of the first resin member 300 from the outer periphery of the first substrate 100 can be prevented.

Further, as shown in FIG. 8, the second resin member 400 may be arranged in each of four corners of the second substrate 200 and one or more portions on each straight line SL. With this, each of four corners of the second substrate 200 is also filled with the second resin member 400, so that the second resin member 400 can further firmly hold the second substrate 200. Accordingly, the bonding force (bonding strength) of the second substrate 200 with respect to the first substrate 100 further improves, so that it is possible to suppress a positional shift of the second substrate 200 with respect to the first substrate 100 and downsize the electronic component 10 (size thereof).

Fourth Embodiment

Figures 9A, 9B:
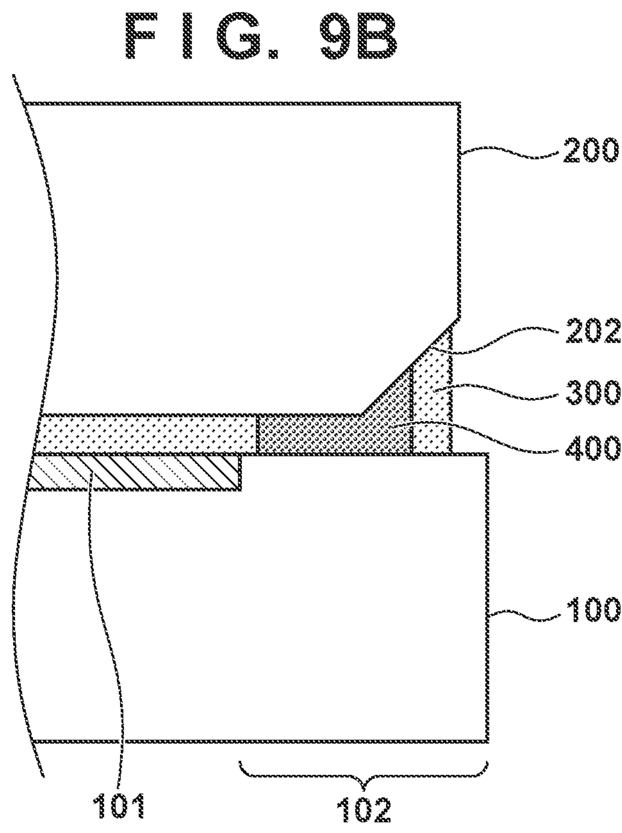
FIGS. 9A and 9B are enlarged views schematically showing a part of the structure of an electronic component in the fourth embodiment of the present invention.

With reference to FIGS. 9A and 9B, an electronic component 10 in the fourth embodiment of the present invention will be described. FIGS. 9A and 9B are enlarged views schematically showing a part (around a first edge surface 202 of a second substrate 200) of the structure of the electronic component 10. Each of FIGS. 9A and 9B shows a sectional view of the electronic component 10.

The electronic component 10 in this embodiment is different from that in the first embodiment in that a first resin member 300 contacts (fills) the first edge surface 202 of the second substrate 200 as shown in FIG. 9A. Since the first resin member 300 contacts the first edge surface 202, protrusion of the first resin member 300 to the outer periphery of a first substrate 100 can be prevented. Further, as shown in FIG. 9B, when the first resin member 300 covers a second resin member 400 contacting the first edge surface 202 of the second substrate 200, the bonding area of the second substrate 200 with respect to the first substrate 100 increases. With this, each of four corners of the second substrate 200 is also filled with the second resin member 400, so that the second resin member 400 can further firmly hold the second substrate 200. Accordingly, the bonding force (bonding strength) of the second substrate 200 with respect to the first substrate 100 further improves, so that it is possible to suppress a positional shift of the second substrate 200 with respect to the first substrate 100 and downsize the electronic component 10 (size thereof).

Fifth Embodiment

Figure 10:
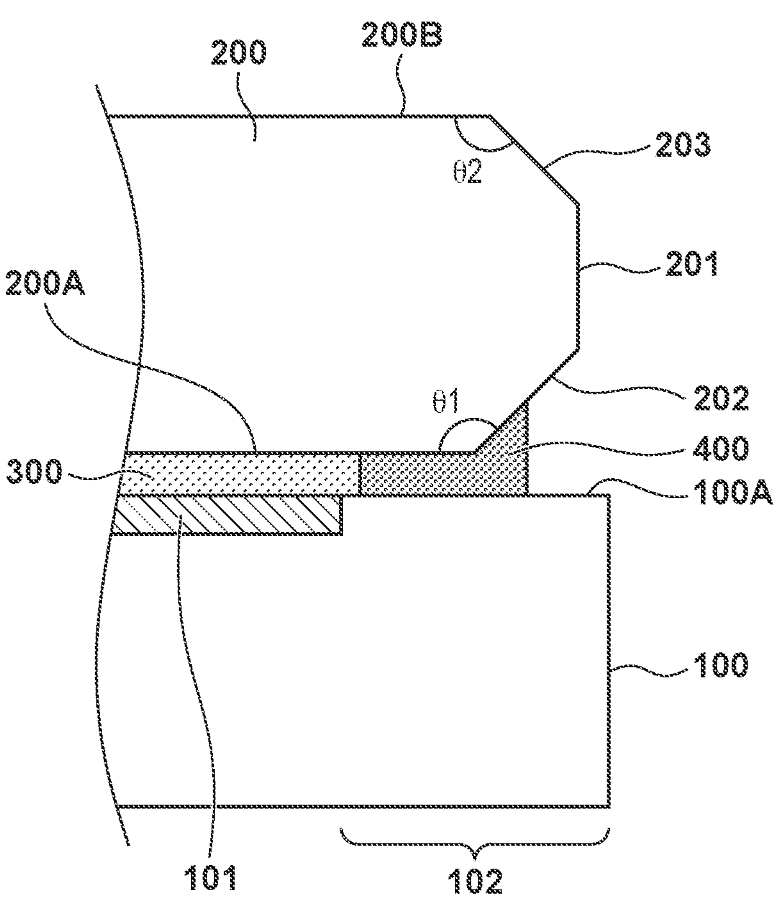
FIG. 10 is an enlarged view schematically showing a part of the structure of an electronic component in the fifth embodiment of the present invention.

With reference to FIG. 10, an electronic component 10 in the fifth embodiment of the present invention will be described. FIG. 10 is an enlarged view schematically showing a part (around a second resin member 400) of the structure of the electronic component 10, and shows a sectional view of the electronic component 10.

The electronic component 10 in this embodiment is different from that in the first embodiment in that a second edge surface 203 is provided between a side surface 201 and a surface 200B (the upper surface on the upper side in FIG. 10) on the opposite side of a main surface 200A of a second substrate 200 as shown in FIG. 10.

The second edge surface 203 is provided over the entire circumference of the outer peripheral region (outer periphery portion) of the second substrate 200. The second edge surface 203 is provided so as to overlap a peripheral region 102 in an orthogonal projection with respect to the peripheral region 102 outside an element region 101 of a first substrate 100. The second edge surface 203 is formed as, for example, a chamfered portion. The angle of the second edge surface 203 with respect to the surface 200B (the inner angle of a structure including the second edge surface 203 and the surface 200B) is an obtuse angle. In other words, an intersection angle θ2 between the surface 200B and the second edge surface 203 of the second substrate 200 is formed to be an obtuse angle. The second edge surface 203 suppresses that the ridge line of the surface 200B of the second substrate 200 is chipped due to contact with a transfer collet or a transfer stage during conveyance of the second substrate 200 in an assembly step. In this manner, by preventing chipping of the ridge line of the surface 200B of the second substrate 200, during assembly, it is possible to prevent foreign matters from entering between the first substrate 100 and the second substrate 200, thereby improving the reliability of the electronic component 10.

Sixth Embodiment

Figure 11A:
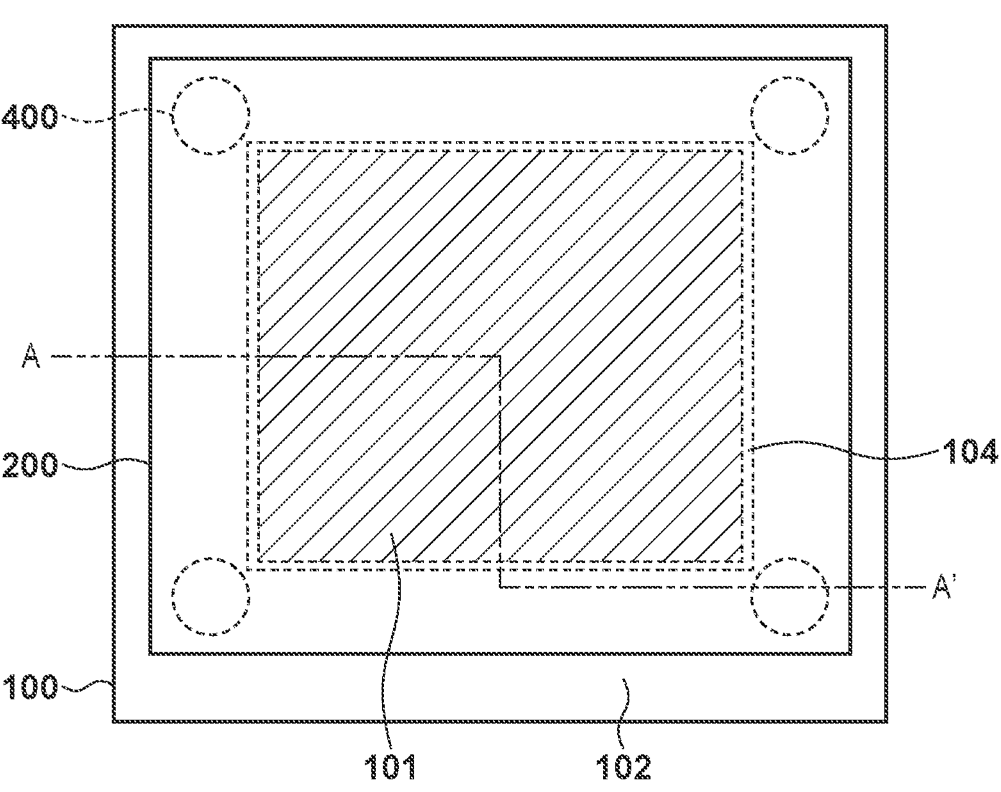
FIGS. 11A and 11B are views schematically showing the structure of an electronic component in the sixth embodiment of the present invention.
Figure 11B:
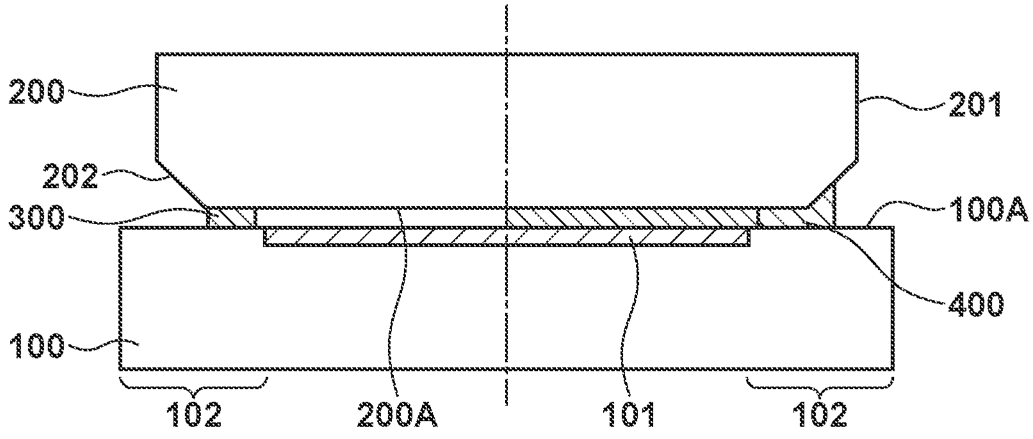

With reference to FIGS. 11A and 11B, an electronic component 10 in the sixth embodiment of the present invention will be described. FIGS. 11A and 11B are views schematically showing the structure of the electronic component 10. FIG. 11A shows a plan view of the electronic component 10, and FIG. 11B shows a sectional view of the electronic component 10 shown in FIG. 11A taken along a line A-A'.

The electronic component 10 in this embodiment is different from that in the first embodiment in that a first resin member 300 does not contact an element region 101 as shown in FIGS. 11A and 11B. In this embodiment, a main surface 100A of the first substrate 100 includes a region 104 located between the first resin member 300 and the element region 101. However, the region 104 may not be included. The first resin member 300 is provided on a peripheral region 102 so as to surround the entire outer circumference of the element region 101, and there is a hollow between the element region 101 and a main surface 200A of a second substrate 200. By providing the hollow structure, the use amount of the first resin member 300 decreases, and the force for holding the second substrate 200 by the first resin member 300 decreases. However, since a second resin member 400 contacts a first edge surface 202 of the second substrate 200, a shift during conveyance can be prevented.

With reference to FIGS. 12A and 12B, a method of manufacturing the electronic component 10 shown in FIGS. 11A and 11B will be described. FIG. 12A shows a plan view of the electronic component 10 (constituent members thereof), and FIG. 12B shows a sectional view of the electronic component 10 (constituent members thereof).

In the first step, as shown in FIGS. 12A and 12B, the first substrate 100 is placed such that the element region 101 faces upward, and a second resin material 401 in a liquid state to be the second resin member 400 is arranged on the peripheral region 102 of the first substrate 100. A first resin material 301 in a liquid state to be the first resin member 300 is also arranged on the peripheral region 102 of the first substrate 100. At this point of time, the first resin material 301 is arranged in a straight line at each of four portions spaced apart from each other. However, the portions may contact each other, and the first resin material 301 may contact the second resin material 401.

Then, in the second step, the second substrate 200 is bonded to the first substrate 100 with the first resin material 301 and the second resin material 401 arranged thereon. The bonding is performed while controlling the gap between the first substrate 100 and the second substrate 200 such that the first resin material 301 to be the first resin member 300 flows while spreading along the main surface 200A of the second substrate 200 but does not contact the element region 101.

Then, in the third step, after bonding the first substrate 100 and the second substrate 200, the first resin material 301 and the second resin material 401 are cured. The first resin material 301 in the liquid state and the second resin material 401 in the liquid state are cured in accordance with the curing method of the first resin material 301 to be the first resin member 300 and the curing method of the second resin material 401 to be the second resin member 400, respectively. With this, the first resin member 300 in a solid state and the second resin member 400 in a solid state are formed.

Comparative Example

With reference to FIG. 13, an electronic component in a related art will be described. FIG. 13 is a view schematically showing the structure of an electronic component in a related art, and shows a sectional view of the electronic component. As shown in FIG. 13, the electronic component in the related art is different from the electronic component 10 in the embodiment, and the first edge surface 203 is not provided between the main surface (the lower surface on the lower side in FIG. 13) of a second substrate 200 and the side surface. Therefore, the force for holding the second substrate 200 by a second resin member 400 is weak, so a positional shift of the second substrate 200 with respect to a first substrate 100 during conveyance cannot be prevented. This becomes conspicuous as a peripheral region 102 of the first substrate 100 is reduced, that is, the electronic component is downsized.

Application examples in which the electronic component 10 according to the embodiment is applied to an image forming device, a display device, a photoelectric conversion device, an electronic apparatus, an illumination device, a moving body, and a wearable device will be described. Here, a description will be given assuming that the electronic element arranged in the element region 101 of the electronic component 10 is, for example, an organic light emitting element such as an organic EL. Details of each component arranged in the element region 101 of the electronic component 10 will be described first, and the application examples will be described after that.

<Arrangement of Organic Light Emitting Element>

The organic light emitting element is provided by forming an insulating layer, a first electrode, an organic compound layer, and a second electrode on a substrate. A protection layer, a color filter, a microlens, and the like may be provided on a cathode. If a color filter is provided, a planarizing layer may be provided between the protection layer and the color filter. The planarizing layer can be formed using acrylic resin or the like. The same applies to a case in which a planarizing layer is provided between the color filter and the microlens.

<Substrate>

Quartz, glass, a silicon wafer, a resin, a metal, or the like may be used as a substrate. Furthermore, a switching element such as a transistor, a wiring pattern, and the like may be provided on the substrate, and an insulating layer may be provided thereon. The material of the insulating layer is not limited as long as a contact hole can be formed so that the wiring pattern can be formed between the first electrode and the substrate and insulation from the unconnected wiring pattern can be ensured. For example, a resin such as polyimide, silicon oxide, silicon nitride, or the like may be used for the insulating layer.

<Electrode>

A pair of electrodes can be used as the electrodes. The pair of electrodes can be an anode and a cathode. If an electric field is applied in the direction in which the organic light emitting element emits light, the electrode having a high potential is the anode, and the other is the cathode. It can also be said that the electrode that supplies holes to the light emitting layer is the anode and the electrode that supplies electrons is the cathode.

As the constituent material of the anode, a material having a large work function may be selected. For example, a metal such as gold, platinum, silver, copper, nickel, palladium, cobalt, selenium, vanadium, or tungsten, a mixture containing some of them, an alloy obtained by combining some of them can be used. As the constituent material of the anode, a metal oxide such as tin oxide, zinc oxide, indium oxide, indium tin oxide (ITO), or zinc indium oxide can also be used. Furthermore, a conductive polymer such as polyaniline, polypyrrole, or polythiophene can also be used as the constituent material of the anode.

One of these electrode materials may be used singly, or two or more of them may be used in combination. The anode may be formed by a single layer or a plurality of layers.

If the electrode is used as a reflective electrode, for example, chromium, aluminum, silver, titanium, tungsten, molybdenum, an alloy thereof, a stacked layer thereof, or the like can be used. The materials as described above can function as a reflective film having no role as an electrode. If a transparent electrode is used as the electrode, an oxide transparent conductive layer made of indium tin oxide (ITO), indium zinc oxide, or the like can be used, but the present invention is not limited thereto. Note that a photolithography technique can be used to form the electrode.

On the other hand, as the constituent material of the cathode, a material having a small work function may be selected. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of them may be used in combination. The cathode may have a single-layer structure or a multilayer structure. Silver may be used as the cathode. To suppress aggregation of silver, a silver alloy may be used. The ratio of the alloy is not limited as long as aggregation of silver can be suppressed. For example, the ratio between silver and another metal may be 1:1, 3:1, or the like.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but if direct current sputtering or alternating current sputtering is used, the good coverage is achieved for the film to be formed, and the resistance of the cathode can be lowered.

<Pixel Isolation Layer>

A pixel isolation layer may be formed by a so-called silicon oxide, such as silicon nitride (SiN), silicon oxynitride (SiON), or silicon oxide (SiO), formed using a Chemical Vapor Deposition (CVD) method. To increase the resistance in the in-plane direction of the organic compound layer, the organic compound layer, especially the hole transport layer may be thinly deposited on the side wall of the pixel isolation layer. More specifically, the organic compound layer can be deposited so as to have a thin film thickness on the side wall by increasing the taper angle of the side wall of the pixel isolation layer or the film thickness of the pixel isolation layer to increase vignetting during vapor deposition.

On the other hand, the taper angle of the side wall of the pixel isolation layer or the film thickness of the pixel isolation layer is adjusted to the extent that no space is formed in the protection layer formed on the pixel isolation layer. Since no space is formed in the protection layer, it is possible to reduce generation of defects in the protection layer. Since generation of defects in the protection layer is reduced, a decrease in reliability caused by a dark spot, a conductive failure of the second electrode, or the like can be reduced.

According to this embodiment, even if the taper angle of the side wall of the pixel isolation layer is not acute, it is possible to effectively suppress leakage of charges to an adjacent pixel. As a result of this consideration, it has been found that the taper angle of 60° (inclusive) to 90° (inclusive) can sufficiently reduce leakage of charges to an adjacent pixel. The film thickness of the pixel isolation layer may be 10 nm (inclusive) to 150 nm (inclusive). A similar effect can be obtained in an arrangement including only pixel electrodes without the pixel isolation layer. In this case, the film thickness of the pixel electrode is set to be equal to or smaller than half the film thickness of the organic layer or the end portion of the pixel electrode is formed to have a forward tapered shape of less than 60°. With this, short circuit of the organic light emitting element can be reduced.

Furthermore, in a case where the first electrode is the cathode and the second electrode is the anode, a high color gamut and low-voltage driving can be achieved by forming the electron transport material and charge transport layer and forming the light emitting layer on the charge transport layer.

<Organic Compound Layer>

The organic compound layer may be formed by a single layer or a plurality of layers. If the organic compound layer includes a plurality of layers, the layers can be called a hole injection layer, a hole transport layer, an electron blocking layer, a light emitting layer, a hole blocking layer, an electron transport layer, and an electron injection layer in accordance with the functions of the layers. The organic compound layer is mainly formed from an organic compound but may contain inorganic atoms and an inorganic compound. For example, the organic compound layer may contain copper, lithium, magnesium, aluminum, iridium, platinum, molybdenum, zinc, or the like. The organic compound layer may be arranged between the first and second electrodes, and may be arranged in contact with the first and second electrodes.

<Protection Layer>

A protection layer may be provided on the cathode. For example, by adhering glass provided with a moisture absorbing agent on the cathode, permeation of water or the like into the organic compound layer can be suppressed and occurrence of display defects can be suppressed. Furthermore, as another embodiment, a passivation layer made of silicon nitride or the like may be provided on the cathode to suppress permeation of water or the like into the organic compound layer. For example, the protection layer can be formed by forming the cathode, transferring it to another chamber without breaking the vacuum, and forming silicon nitride having a thickness of 2 μm by the CVD method. The protection layer may be provided using an atomic layer deposition (ALD) method after deposition of the protection layer using the CVD method. The material of the protection layer by the ALD method is not limited but can be silicon nitride, silicon oxide, aluminum oxide, or the like. Silicon nitride may further be formed by the CVD method on the protection layer formed by the ALD method.

The protection layer formed by the ALD method may have a film thickness smaller than that of the protection layer formed by the CVD method. More specifically, the film thickness of the protection layer formed by the ALD method may be 50% or less, or 10% or less of that of the protection layer formed by the CVD method.

<Color Filter>

A color filter may be provided on the protection layer. For example, a color filter considering the size of the organic light emitting element may be provided on another substrate, and the substrate with the color filter formed thereon may be bonded to the substrate with the organic light emitting element provided thereon. Alternatively, for example, a color filter may be patterned on the above-described protection layer using a photolithography technique. The color filter may be formed from a polymeric material.

<Planarizing Layer>

A planarizing layer may be provided between the color filter and the protection layer. The planarizing layer is provided to reduce unevenness of the layer below the planarizing layer. The planarizing layer may be called a material resin layer without limiting the purpose of the layer. The planarizing layer may be formed from an organic compound, and may be made of a low-molecular material or a polymeric material. In consideration of reduction of unevenness, a polymeric organic compound may be used for the planarizing layer.

The planarizing layers may be provided above and below the color filter. In that case, the same or different constituent materials may be used for these planarizing layers. More specifically, examples of the material of the planarizing layer include polyvinyl carbazole resin, polycarbonate resin, polyester resin, ABS resin, acrylic resin, polyimide resin, phenol resin, epoxy resin, silicone resin, and urea resin.

<Microlens>

The organic light emitting device may include an optical member such as a microlens on the light emission side. The microlens is made of acrylic resin, epoxy resin, or the like. The microlens can aim to increase the amount of light extracted from the organic light emitting device and control the direction of light to be extracted. The microlens can have a hemispherical shape. If the microlens has a hemispherical shape, among tangents contacting the hemisphere, there is a tangent parallel to the insulating layer, and the contact between the tangent and the hemisphere is the vertex of the microlens. The vertex of the microlens can be decided in the same manner even in an arbitrary sectional view. Accordingly, among tangents contacting the semicircle of the microlens in a sectional view, there is a tangent parallel to the insulating layer, and the contact between the tangent and the semicircle is the vertex of the microlens.

Furthermore, the middle point of the microlens can also be defined. In the section of the microlens, a line segment from a point at which an arc shape ends to a point at which another arc shape ends is assumed, and the middle point of the line segment can be called the middle point of the microlens. A section for determining the vertex and the middle point may be a section perpendicular to the insulating layer.

The microlens includes a first surface including a convex portion and a second surface on the opposite side of the first surface. The second surface is arranged on the functional layer (light emitting layer) side of the first surface. In order to implement this arrangement, the microlens needs to be formed on the light emitting device. If the functional layer is an organic layer, a process which produces high temperature in the manufacturing step of the microlens may be avoided. In addition, if it is configured to arrange the second surface on the functional layer side of the first surface, all the glass transition temperatures of an organic compound forming the organic layer may be 100° C. or more. For example, 130° C. or more is suitable.

<Counter Substrate>

A counter substrate may be arranged on the planarizing layer. The counter substrate is called a counter substrate because it is provided at a position corresponding to the above-described substrate. The constituent material of the counter substrate can be the same as that of the above-described substrate. If the above-described substrate is the first substrate, the counter substrate is the second substrate.

<Organic Layer>

The organic compound layer (hole injection layer, hole transport layer, electron blocking layer, light emitting layer, hole blocking layer, electron transport layer, electron injection layer, and the like) forming the organic light emitting element in the embodiment may be formed by the method to be described below.

The organic compound layer forming the organic light emitting element in the embodiment can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the layer is formed by a vacuum deposition method, a solution coating method, or the like, crystallization or the like hardly occurs and excellent temporal stability is obtained. Furthermore, when the layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

<Pixel Circuit>

The light emitting device can include a pixel circuit connected to the light emitting element. The pixel circuit may be an active matrix circuit that individually controls light emission of the first and second light emitting elements. The active matrix circuit may be a voltage or current programing circuit. A driving circuit includes a pixel circuit for each pixel. The pixel circuit can include a light emitting element, a transistor for controlling light emission luminance of the light emitting element, a transistor for controlling a light emission timing, a capacitor for holding the gate voltage of the transistor for controlling the light emission luminance, and a transistor for connection to GND without intervention of the light emitting element.

The light emitting device includes a display region and a peripheral region arranged around the display region. The light emitting device includes the pixel circuit in the display region and a display control circuit in the peripheral region. The mobility of the transistor forming the pixel circuit may be smaller than that of a transistor forming the display control circuit.

The slope of the current-voltage characteristic of the transistor forming the pixel circuit may be smaller than that of the current-voltage characteristic of the transistor forming the display control circuit. The slope of the current-voltage characteristic can be measured by a so-called Vg-Ig characteristic.

The transistor forming the pixel circuit is a transistor connected to the light emitting element such as the first light emitting element.

<Pixel>

The organic light emitting device includes a plurality of pixels. Each pixel includes sub-pixels that emit light components of different colors. The sub-pixels may include, for example, R, G, and B emission colors, respectively.

In each pixel, a region also called a pixel opening emits light. The pixel opening can have a size of 5 μm (inclusive) to 15 μm (inclusive). More specifically, the pixel opening can have a size of 11 μm, 9.5 μm, 7.4 μm, 6.4 μm, or the like.

A distance between the sub-pixels can be 10 am or less, and can be, more specifically, 8 μm, 7.4 μm, or 6.4 μm.

The pixels can have a known arrangement form in a plan view. For example, the pixels may have a stripe arrangement, a delta arrangement, a pentile arrangement, or a Bayer arrangement. The shape of each sub-pixel in a plan view may be any shape known in the art. For example, a quadrangle such as a rectangle or a rhombus, a hexagon, or the like may be possible. Note that a shape which is not a correct shape but is close to a rectangle is included in a rectangle, as a matter of course. The shape of the sub-pixel and the pixel arrangement can be used in combination.

<Application of Organic Light Emitting Element in Embodiment>

The organic light emitting element in the embodiment can be used as a constituent member of a display device or an illumination device. In addition, the organic light emitting element in the embodiment can also be used in the exposure light source of an electrophotographic image forming device, the backlight of a liquid crystal display device, a light emitting device including a color filter in a white light source, and the like.

The display device may be an image information processing device that includes an image input unit for inputting image information from an area CCD, a linear CCD, a memory card, or the like, and an information processing unit for processing the input information, and displays the input image on a display unit.

In addition, a display unit included in an image capturing device or an inkjet printer can have a touch panel function. The driving type of the touch panel function may be an infrared type, a capacitance type, a resistive film type, or an electromagnetic induction type, and is not particularly limited. The display device may be used for the display unit of a multifunction printer.

Figures 14A, 14B:
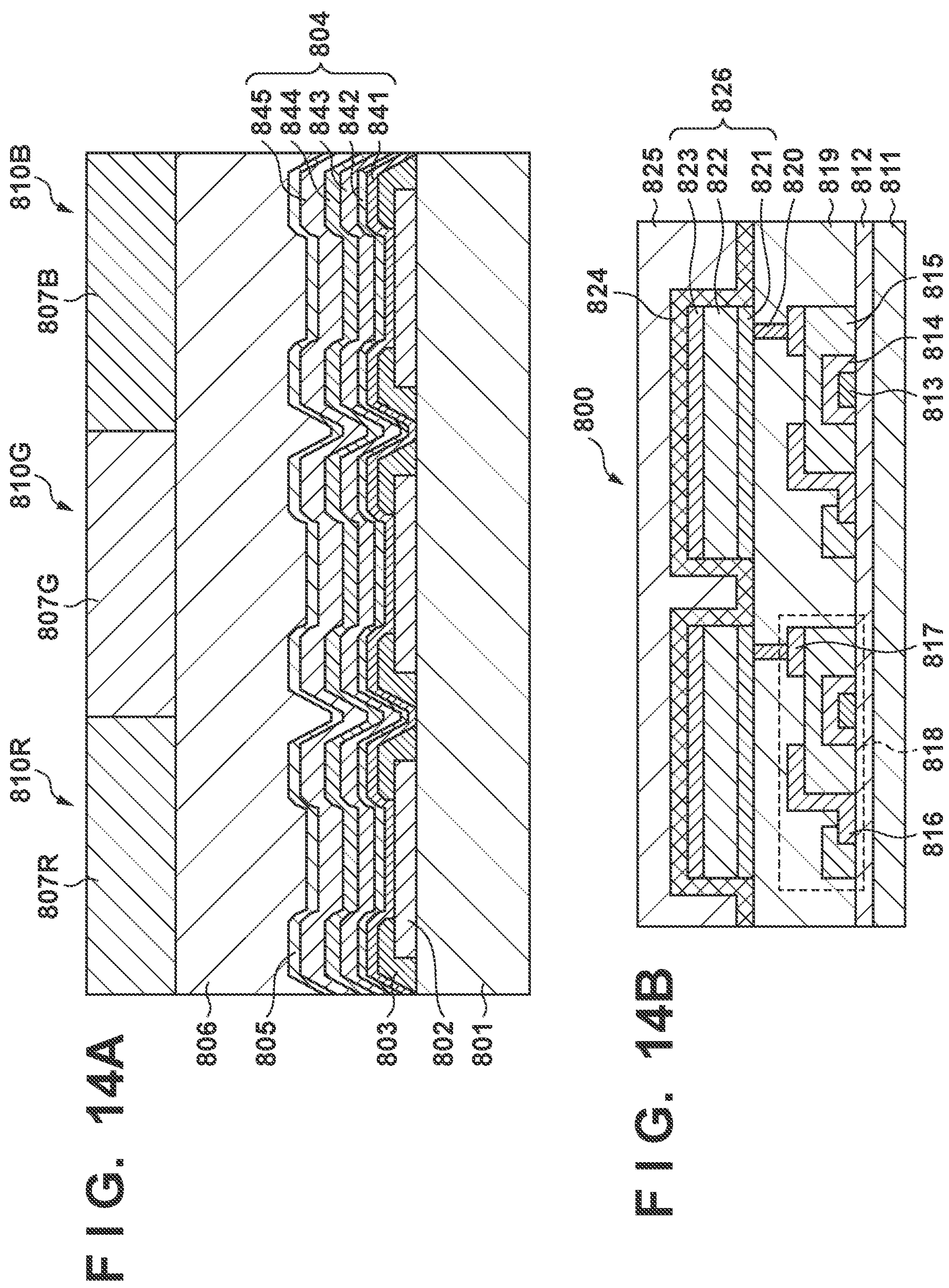
FIGS. 14A and 14B are sectional views showing an example of the arrangement of a pixel of an electronic component in the embodiment.

More details will be described next with reference to the accompanying drawings. FIG. 14A shows an example of a pixel as a constituent element of the above-described element region 101. The pixel includes sub-pixels 810. The sub-pixels are divided into sub-pixels 810R, 810G, and 810B by emitted light components. The light emission colors may be discriminated by the wavelengths of light components emitted from the light emitting layers, or light emitted from each sub-pixel may be selectively transmitted or undergo color conversion by a color filter or the like. The sub-pixel includes a reflective electrode 802 as the first electrode on an interlayer insulating layer 801, an insulating layer 803 covering the end of the reflective electrode 802, an organic compound layer 804 covering the first electrode and the insulating layer, a transparent electrode 805 as the second electrode, a protection layer 806, and a color filter 807.

The interlayer insulating layer 801 can include a transistor and a capacitive element arranged in the interlayer insulating layer 801 or a layer below it. The transistor and the first electrode can electrically be connected via a contact hole (not shown) or the like.

The insulating layer 803 is also called a bank or a pixel isolation film. The insulating layer 803 covers the end of the first electrode, and is arranged to surround the first electrode. A portion of the first electrode where no insulating layer 803 is arranged is in contact with the organic compound layer 804 to form a light emitting region.

The organic compound layer 804 includes a hole injection layer 841, a hole transport layer 842, a first light emitting layer 843, a second light emitting layer 844, and an electron transport layer 845.

The second electrode may be a transparent electrode, a reflective electrode, or a semi-transmissive electrode.

The protection layer 806 suppresses permeation of water into the organic compound layer. The protection layer 806 may include a single layer or a plurality of layers. Each layer can be an inorganic compound layer or an organic compound layer.

The color filter 807 is divided into color filters 807R, 807G, and 807B by colors. The color filters 807 may be formed on a planarizing film (not shown). A resin protection layer (not shown) may be arranged on the color filters 807. The color filters 807 may be formed on the protection layer 806. Alternatively, the color filters 807 may be provided on the counter substrate such as a glass substrate, and then the substrate may be bonded.

As shown in FIG. 14B, a display device 800 includes an organic light emitting element 826 and a TFT 818 as an example of a transistor. An insulating layer 812 is provided on a substrate 811 of glass, silicon, or the like. The active element such as the TFT 818 is arranged on the insulating layer 812, and a gate electrode 813, a gate insulating film 814, and a semiconductor layer 815 forming the active element are arranged. The TFT 818 further includes the semiconductor layer 815, a drain electrode 816, and a source electrode 817. An insulating film 819 is provided on the TFT 818. The source electrode 817 and an anode 821 forming the organic light emitting element 826 are connected via a contact hole 820 formed in the insulating film 819.

A method of electrically connecting the electrodes (anode and cathode) included in the organic light emitting element 826 and the electrodes (source electrode and drain electrode) included in the TFT is not limited to that shown in FIG. 14B. One of the anode and cathode of the organic light emitting element 826 and one of the source electrode and drain electrode of the TFT are electrically connected. The TFT means a thin-film transistor.

In the display device 800 shown in FIG. 14B, an organic compound layer 822 is illustrated as one layer. However, the organic compound layer 822 may include a plurality of layers. A first protection layer 824 and a second protection layer 825 are provided on a cathode 823 to suppress deterioration of the organic light emitting element.

A transistor is used as a switching element in the display device 800 shown in FIG. 14B, but another switching element may be used in place of the transistor.

The transistor used in the display device 800 shown in FIG. 14B is not limited to a transistor using a single-crystal silicon wafer, and may be a thin-film transistor including an active layer on an insulating surface of a substrate. Examples of the active layer include single-crystal silicon, amorphous silicon, non-single-crystal silicon such as microcrystalline silicon, and a non-single-crystal oxide semiconductor such as indium zinc oxide and indium gallium zinc oxide. Note that a thin-film transistor is also called a TFT element.

The transistor included in the display device 800 shown in FIG. 14B may be formed in the substrate such as a silicon substrate. Forming the transistor in the substrate means forming the transistor by processing the substrate such as a silicon substrate. In other words, when the transistor is included in the substrate, this means that the substrate and the transistor are formed integrally.

The light emission luminance of the organic light emitting element in the embodiment can be controlled by the TFT which is an example of a switching element, and the plurality of organic light emitting elements can be provided in a plane to display an image with the light emission luminances of the respective elements. Here, the switching element in the embodiment is not limited to the TFT, and may be a transistor formed from low-temperature polysilicon or an active matrix driver formed on the substrate such as a silicon substrate. Note that the term "on the substrate" also means "in the substrate". Whether to provide a transistor in the substrate or use a TFT is selected based on the size of the display unit. For example, if the size is about 0.5 inch, the organic light emitting element is preferably provided on the silicon substrate.

Figure 15:
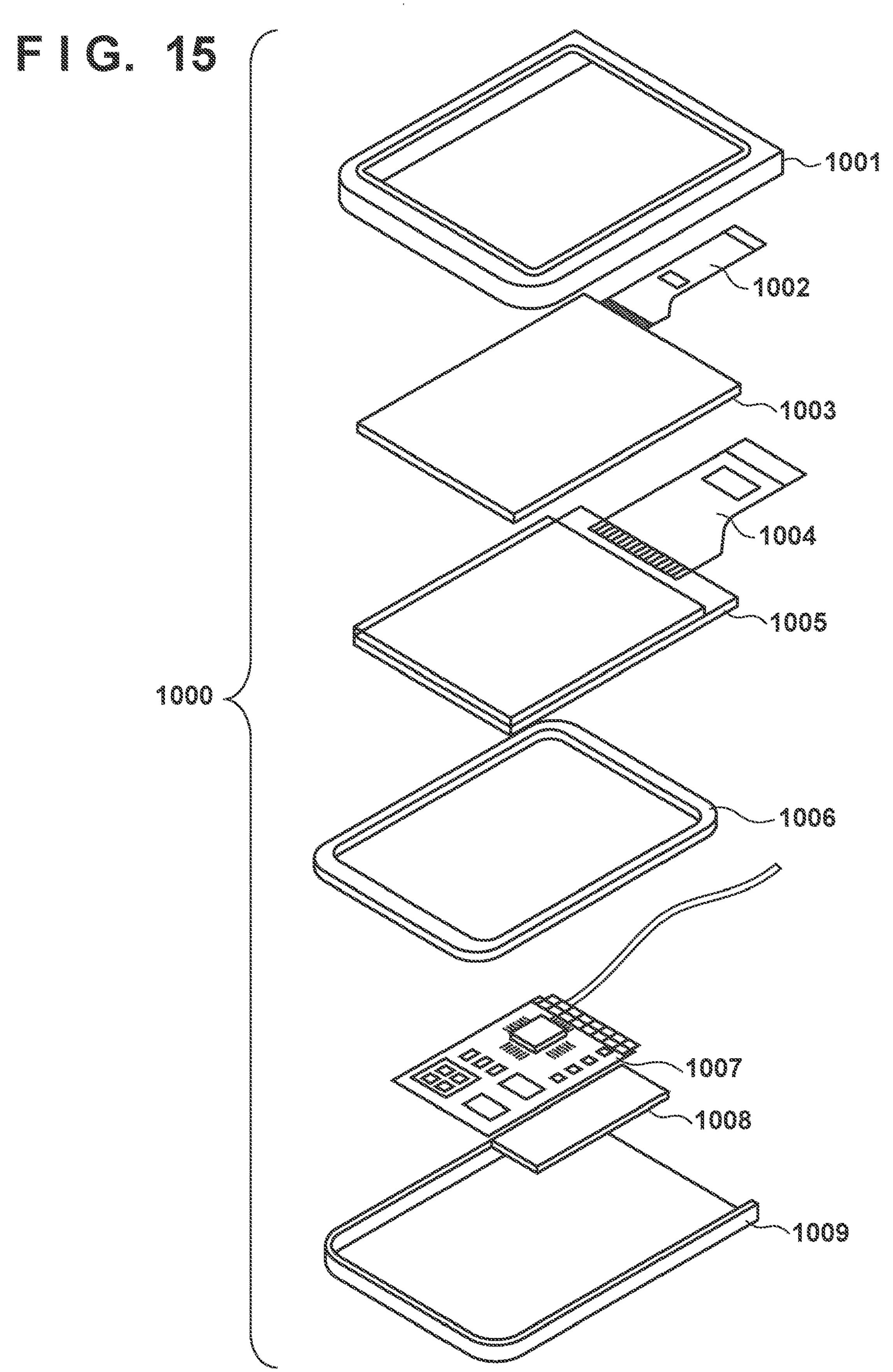
FIG. 15 is a view showing an example of a display device using the electronic component in the embodiment.

FIG. 15 is a view schematically showing an example of a display device 1000 using the electronic component 10 in the embodiment. The display device 1000 includes an upper cover 1001 and a lower cover 1009, and further includes a touch panel 1003, a display panel 1005, a frame 1006, a circuit board 1007, and a battery 1008 between the upper cover 1001 and the lower cover 1009. Flexible printed circuits (FPCs) 1002 and 1004 are respectively connected to the touch panel 1003 and the display panel 1005. Active elements such as transistors are arranged on the circuit board 1007. The battery 1008 is unnecessary if the display device 1000 is not a portable apparatus. If the display device 1000 is a portable apparatus, the battery 1008 may be provided at a position different from the illustrated position. The electronic component 10 is applied to the display panel 1005. The pixels arranged in the element region 101 of the electronic component 10 functioning as the display panel 1005 operate in a state in which they are connected to the active elements such as transistors arranged on the circuit board 1007.

The display device 1000 shown in FIG. 15 can be used for a display unit of a photoelectric conversion device (also referred to as an image capturing device) including an optical unit having a plurality of lenses, and an image sensor for receiving light having passed through the optical unit and photoelectrically converting the light into an electric signal. The photoelectric conversion device can include a display unit for displaying information acquired by the image sensor. In addition, the display unit can be either a display unit exposed outside the photoelectric conversion device, or a display unit arranged in the finder. The photoelectric conversion device can be a digital camera or a digital video camera.

FIG. 16 is a view schematically showing an example of a photoelectric conversion device 1100 using the electronic component 10 in the embodiment. The photoelectric conversion device 1100 includes a viewfinder 1101, a rear display 1102, an operation unit 1103, and a housing 1104. The photoelectric conversion device 1100 is also called an image capturing device. The electronic component 10 in the embodiment is applied to the viewfinder 1101 or the rear display 1102 serving as a display unit. In this case, the element region 101 of the electronic component 10 may display not only an image to be captured but also environment information, image capturing instructions, and the like. Examples of the environment information are the intensity and direction of external light, the moving velocity of an object, and the possibility that an object is covered with an obstacle.

The timing suitable for image capturing is a very short time in many cases, so the information is preferably displayed as soon as possible. Therefore, the electronic component 10 in which the pixel including the light emitting element using the organic light emitting material such as an organic EL element is arranged in the element region 101 is preferable for the viewfinder 1101 or the rear display 1102. The organic light emitting material has a high response speed. The electronic component 10 using the organic light emitting material is preferable for the devices that require a high display speed, and more suitable than for the liquid crystal display device.

The photoelectric conversion device 1100 includes an optical unit (not shown). This optical unit has a plurality of lenses, and forms an image on a photoelectric conversion element (not shown) that receives light having passed through the optical unit and is accommodated in the housing 1104. The focal points of the plurality of lenses can be adjusted by adjusting the relative positions. The operation regarding focal point adjustment can also automatically be performed.

The electronic component 10 may be applied to a display unit of an electronic apparatus such as a portable terminal. At this time, the display unit may have both a display function and an operation function. Examples of the portable terminal are a portable phone such as a smartphone, a tablet, and a head mounted display.

FIG. 17 is a view schematically showing an example of an electronic apparatus using the electronic component 10 in the embodiment. An electronic apparatus 1200 includes a display unit 1201, an operation unit 1202, and a housing 1203. The housing 1203 may be provided with a circuit, a printed board having this circuit, a battery, a communication unit, and the like. The operation unit 1202 can be a button or a touch-panel-type reaction unit. The operation unit 1202 can also be a biometric authentication unit that performs unlocking or the like by authenticating the fingerprint. The portable apparatus including the communication unit can also be called a communication apparatus. The electronic component 10 in the embodiment is applied to the display unit 1201.

Figure 18A:
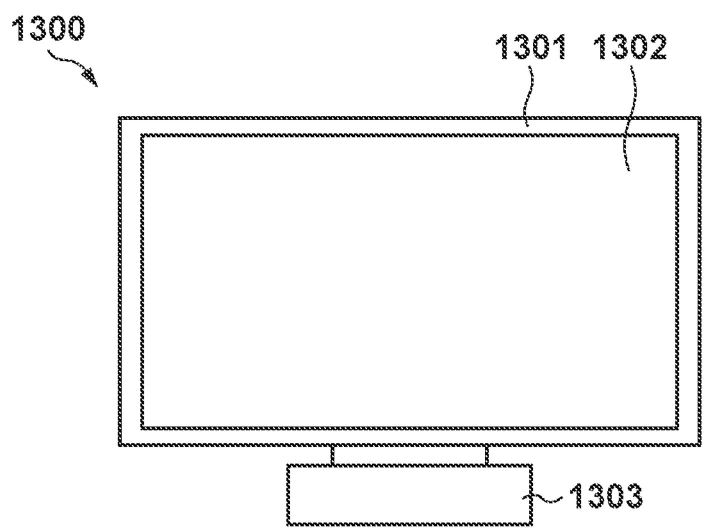
FIGS. 18A and 18B are views each showing an example of a display device using the electronic component in the embodiment.
Figure 18B:
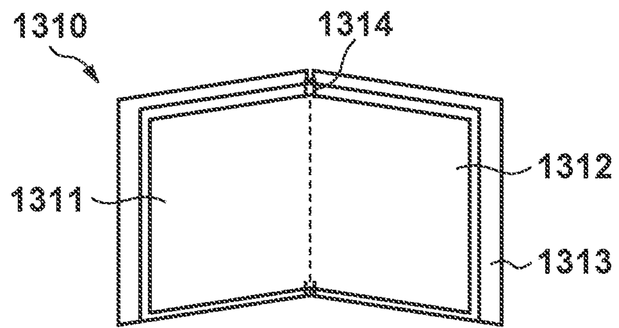

FIGS. 18A and 18B are views schematically showing examples of the display device using the electronic component 10 in the embodiment. FIG. 18A shows a display device 1300 such as a television monitor or a PC monitor. The display device 1300 includes a frame 1301 and a display unit 1302. The electronic component 10 in the embodiment is applied to the display unit 1302. The display device 1300 may include a base 1303 that supports the frame 1301 and the display unit 1302. The base 1303 is not limited to the form shown in FIG. 18A. For example, the lower side of the frame 1301 may also function as the base 1303. In addition, the frame 1301 and the display unit 1302 may be formed by a curved surface. The radius of curvature in this case is, for example, 5,000 mm (inclusive) to 6,000 mm (inclusive).

FIG. 18B is a view schematically showing another example of the display device using the electronic component 10 in the embodiment. A display device 1310 shown in FIG. 18B is a display device formed to be foldable, which is a so-called foldable display device. The display device 1310 includes a first display unit 1311, a second display unit 1312, a housing 1313, and a bending point 1314. The electronic component 10 in the embodiment is applied to each of the first display unit 1311 and the second display unit 1312. The first display unit 1311 and the second display unit 1312 may also be one seamless display device. The first display unit 1311 and the second display unit 1312 can be divided by the bending point 1314. The first display unit 1311 and the second display unit 1312 may display different images, or may display one image together.

Figure 19:
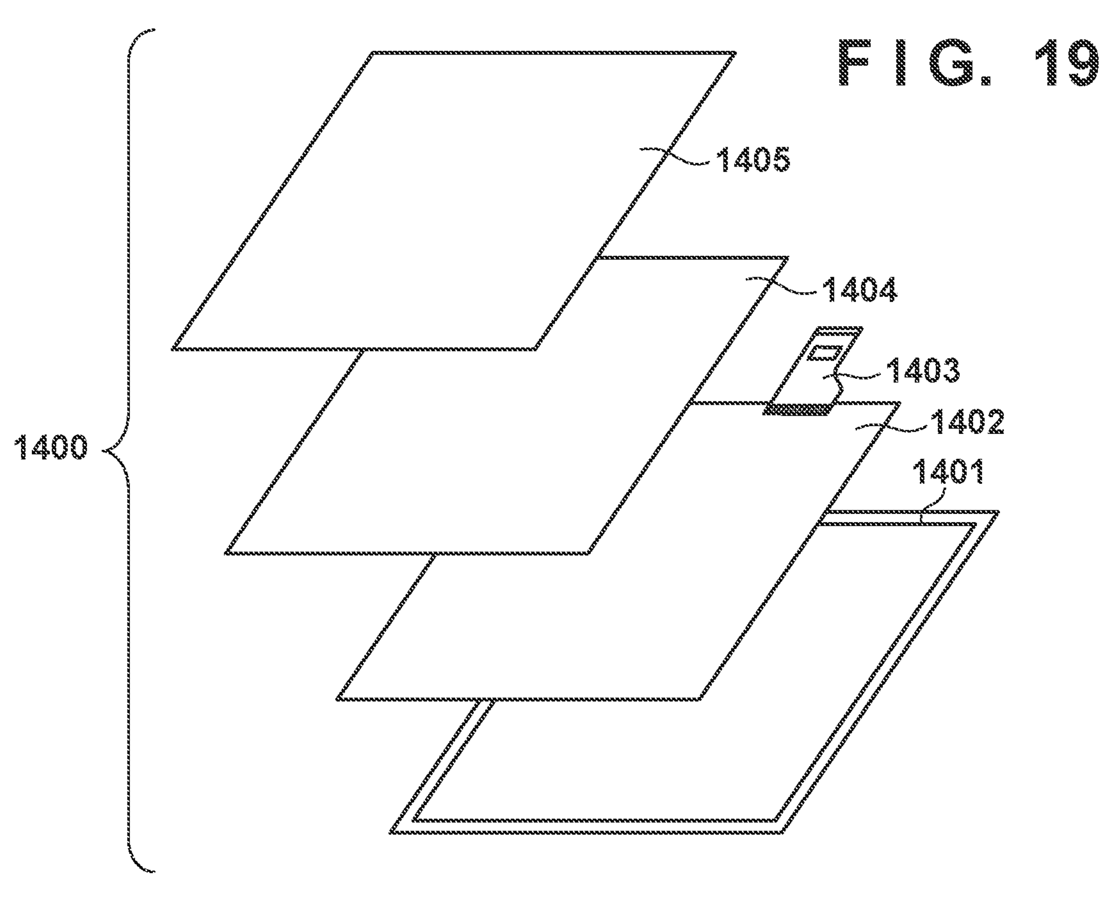
FIG. 19 is a view showing an example of an illumination device using the electronic component in the embodiment.

FIG. 19 is a view schematically showing an example of an illumination device 1400 using the electronic component 10 in the embodiment. The illumination device 1400 includes a housing 1401, a light source 1402, a circuit board 1403, an optical film 1404, and a light diffusion unit 1405. The electronic component 10 in the embodiment is applied to the light source 1402. The optical film 1404 may be a filter that improves the color rendering property of the light source. The light diffusion unit 1405 can effectively diffuse light from the light source to illuminate a wide range for lighting up or the like. A cover may be provided in the outermost portion of the illumination device 1400, as needed. The illumination device 1400 may include both the optical film 1404 and the light diffusion unit 1405, or may include only one of the optical film 1404 and the light diffusion unit 1405.

The illumination device 1400 is, for example, a device that illuminates a room. The illumination device 1400 may emit light of white, day white, or any other color from blue to red. The illumination device 1400 may include a light control circuit for controlling the light color. The illumination device 1400 may include a power supply circuit connected to the electronic component 10 which functions as the light source 1402. The power supply circuit is a circuit that converts an AC voltage into a DC voltage. Note that white light has a color temperature of 4200K, and day-white light has a color temperature of 5000K. The illumination device 1400 may also include a color filter. Further, the illumination device 1400 may include a heat dissipation portion. The heat dissipation portion releases the heat in the device to the outside of the device, and examples thereof include a metal having high specific heat, liquid silicon, and the like.

Figure 20:
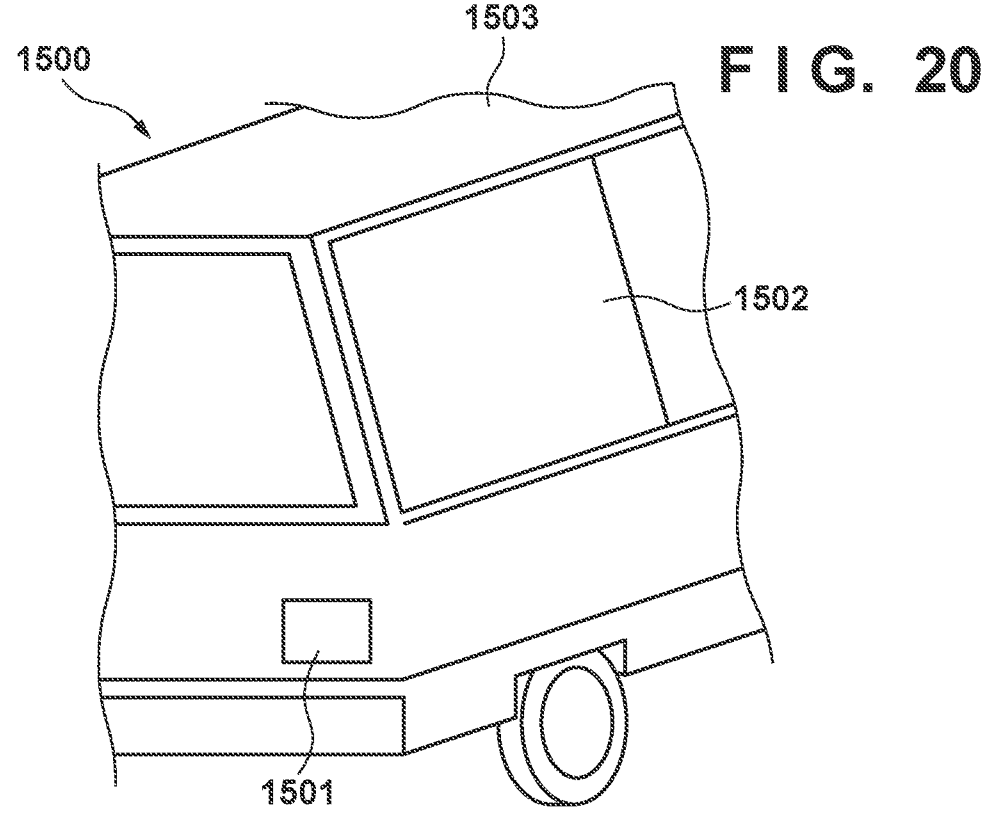
FIG. 20 is a view showing an example of a moving body using the electronic component in the embodiment.

FIG. 20 is a view schematically showing an automobile including a tail lamp which is an example of the lighting unit for an automobile using the electronic component 10 in the embodiment. An automobile 1500 includes a tail lamp 1501, and turns on the tail lamp 1501, for example, when a brake operation or the like is performed. The electronic component 10 in the embodiment may be used in a head lamp as the lighting unit for an automobile. The automobile 1500 is an example of a moving body, and the moving body includes a ship, a drone, an aircraft, a railroad car, an industrial robot, and the like. The moving body includes a body and a lighting unit provided in the body. The lighting unit may inform the current position of the body.

The electronic component 10 in the embodiment is applied to the tail lamp 1501. The tail lamp 1501 may include a protective member that protects the electronic component 10 which functions as the tail lamp 1501. The protective member has a certain degree of strength. The material of the protective member is not limited as long as it is transparent. For example, the protective member is made from polycarbonate or the like. The protective member may be made from a material obtained by mixing polycarbonate with furandicarboxylic acid derivative, acrylonitrile derivative, or the like.

The automobile 1500 includes a body 1503 and windows 1502 attached to the body 1503. The window 1502 may be a window for checking the front or rear of the automobile 1500, or may a transparent display such as a head-up display. The electronic component 10 in the embodiment may be used for the transparent display. In this case, the components such as the electrodes included in the electronic component 10 are formed by transparent members.

Further application examples of the electronic component 10 in the embodiment will be described with reference to FIGS. 21A and 21B. The electronic component 10 can be applied to a system that can be worn as a wearable device such as smartglasses, a Head Mounted Display (HMD), or a smart contact lens. An image capturing display device used for such application examples includes an image capturing device capable of photoelectrically converting visible light and a light emitting device capable of emitting visible light.

Figure 21A:
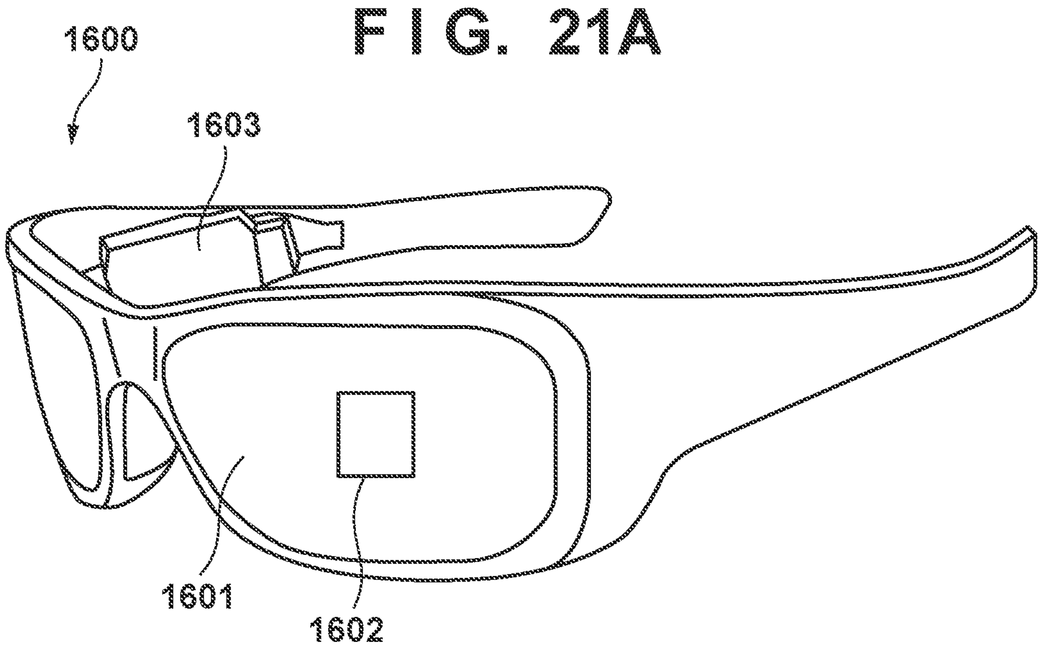
FIGS. 21A and 21B are views each showing an example of a wearable device using the electronic component in the embodiment.

FIG. 21A is a view schematically showing glasses 1600 (smartglasses) in one application example. An image capturing device 1602 such as a CMOS sensor or an SPAD is provided on the surface side of a lens 1601 of the glasses 1600. In addition, the electronic component 10 in the embodiment is provided on the back surface side of the lens 1601.

The glasses 1600 further include a control device 1603. The control device 1603 functions as a power supply that supplies electric power to the image capturing device 1602 and the electronic component 10. In addition, the control device 1603 controls the operations of the image capturing device 1602 and the electronic component 10. An optical system configured to condense light to the image capturing device 1602 is provided on the lens 1601.

Figure 21B:
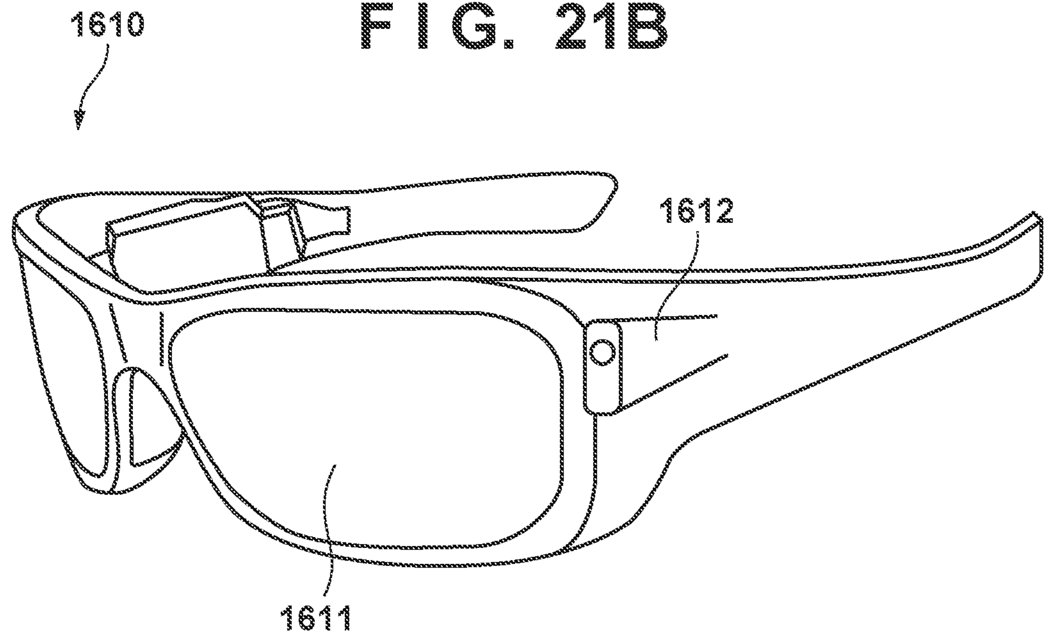

FIG. 21B is a view schematically showing glasses 1610 (smartglasses) according to one application example. The glasses 1610 include a control device 1612, and an image capturing device corresponding to the image capturing device 1602 and the electronic component 10 are mounted on the control device 1612. The lens 1611 is provided with the image capturing device mounted in the control device 1612, and an optical system configured to project light emitted from the electronic component 10, and an image is projected to the lens 1611. The control device 1612 functions as a power supply that supplies electric power to the image capturing device and the electronic component 10, and controls the operations of the image capturing device and the electronic component 10. The control device 1612 may include a line-of-sight detection unit that detects the line of sight of a wearer (user). The detection of a line of sight of the wearer may be done using infrared rays. An infrared ray emitting unit emits infrared rays to an eyeball of the wearer who is gazing at a displayed image. An image capturing unit including a light receiving element detects reflected light from the eyeball, thereby obtaining a captured image of the eyeball. A reduction unit for reducing light from the infrared ray emitting unit to the display unit in a planar view is provided, thereby reducing deterioration of image quality.

The line of sight of the wearer to the displayed image is detected from the captured image of the eyeball obtained by capturing the infrared rays. A method known in the art can be applied to the line-of-sight detection using the captured image of the eyeball. For example, a line-of-sight detection method based on a Purkinje image obtained by reflection of irradiation light by a cornea can be used.

More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the wearer.

In this embodiment, an image capturing device including a light receiving element may be included, and a displayed image may be controlled based on the line-of-sight information of the wearer from the image capturing device.

More specifically, a first visual field region at which the user is gazing and a second visual field region other than the first visual field region are decided based on the line-of-sight information. The first visual field region and the second visual field region may be decided by the control device, or those decided by an external control device may be received. In the display region, the display resolution of the first visual field region may be controlled to be higher than the display resolution of the second visual field region. In other words, the resolution of the second visual field region may be lower than that of the first visual field region.

In addition, the display region includes a first display region and a second display region different from the first display region, and a region of higher priority is decided from the first display region and the second display region based on line-of-sight information. The region of higher priority may be decided by the control device, or those decided by an external control device may be received. The resolution of the region of higher priority may be controlled to be higher than the resolution of the region other than the region of higher priority. In other words, the resolution of the region of relatively low priority may be low.

Note that AI may be used to decide the first visual field region or the region of higher priority. The AI is a model configured to estimate the angle of the line of sight and the distance to a target ahead the line of sight from the image of the eyeball using, for example, the image of the eyeball and the direction of actual viewing of the eyeball included in the image as supervised data. The AI program may be held by the display device, the image capturing device, or an external device. If the external device holds the AI program, it is transmitted to the display device via communication.

When performing display control based on line-of-sight detection, smartglasses further including an image capturing device configured to capture the outside can be applied. The smartglasses can display captured outside information in real time.

FIGS. 22A to 22C are views schematically showing an example of an image forming device 926 using the electronic component 10 in the embodiment. The image forming device 926 shown in FIG. 22A includes a photosensitive member 927, an exposure light source 928, a developing unit 931, a charging unit 930, a transfer device 932, a conveyance unit 933 (a conveyance roller shown in FIG. 22A), and a fixing device 935.

Light 929 is emitted from the exposure light source 928, and an electrostatic latent image is formed on the surface of the photosensitive member 927. The electronic component 10 in the embodiment is applied to the exposure light source 928. The developing unit 931 functions as a developing device that contains a toner or the like as a developing agent and applies the developing agent to the exposed photosensitive member 927. The charging unit 930 charges the photosensitive member 927. The transfer device 932 transfers the developed image to a print medium 934. The conveyance unit 933 conveys the print medium 934. The print medium 934 includes, for example, paper or a film. The fixing device 935 fixes the image formed on the print medium 934.

Each of FIGS. 22B and 22C is a view schematically showing a plurality of light emitting units 936 arranged along the longitudinal direction on a long substrate in the exposure light source 928. The electronic component 10 in the embodiment is applied to the light emitting units 936. For example, the plurality of pixels arranged in the element region 101 of the electronic component 10 are arrayed along the longitudinal direction of the substrate. A direction 937 is a direction parallel to the axis of the photosensitive member 927. This column direction matches the direction of the axis upon rotating the photosensitive member 927. This direction 937 can be referred to as the long-axis direction of the photosensitive member 927.

FIG. 22B shows a form in which the light emitting units 936 are arranged along the long-axis direction of the photosensitive member 927. FIG. 22C shows a modification of the arrangement of the light emitting units 936 shown in FIG. 22B, and shows a form in which the light emitting units 936 are arranged in the column direction alternately between the first column and the second column. The light emitting units 936 are arranged at different positions in the row direction between the first column and the second column. In the first column, multiple light emitting units 936 are arranged spaced apart from each other. In the second column, the light emitting unit 936 is arranged at the position corresponding to the space between the light emitting units 936 in the first column. Also in the row direction, multiple light emitting units 936 are arranged spaced apart from each other. It can also be said that the arrangement of the light emitting units 936 shown in FIG. 22C is, for example, an arrangement in a grid pattern, an arrangement in a staggered pattern, or an arrangement in a checkered pattern.

The individual terms described in this specification are merely used for the purpose of explaining the present invention, and the present invention is not limited to the strict meanings of the terms and also incorporates their equivalents.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2023-021868 filed on Feb. 15, 2023, and Japanese Patent application No. 2023-197589 filed on Nov. 21, 2023, which are hereby incorporated by reference herein in their entirety.

What is claimed is:

1. An electronic component comprising:

a first substrate that includes an element region where an element is formed, and a peripheral region which is a region around the element region;

a second substrate that is arranged so as to face the first substrate, and that includes a lower surface facing the element region, a side surface, and a first edge surface provided between the lower surface and the side surface; and a first resin member arranged between the first substrate and the second substrate so as to contact the peripheral region and the first edge surface, wherein the first edge surface includes a contact region in contact with the first resin member, and a non-contact region not in contact with the first resin member.

2. The component according to claim 1, wherein the first edge surface is provided so as to overlap the peripheral region in an orthogonal projection with respect to the peripheral region.

3. The component according to claim 1, wherein the first edge surface is provided over an entire circumference of an outer peripheral region of the second substrate.

4. The component according to claim 1, wherein an angle of the first edge surface with respect to the lower surface is an obtuse angle.

5. The component according to claim 1, further comprising a second resin member arranged between the first substrate and the second substrate so as to cover the element region.

6. The component according to claim 1, wherein the non-contact region is located between the contact region and the side surface.

7. The component according to claim 1, further comprising a spacer arranged between the first substrate and the second substrate, wherein the spacer is covered with the first resin member.

8. The component according to claim 5, wherein the second resin member is provided so as to cover the first resin member.

9. The component according to claim 5, wherein the second resin member is provided so as to contact the first edge surface.

10. The component according to claim 5, wherein the second resin member is provided so as to cover the first resin member contacting the first edge surface.

11. The component according to claim 1, wherein the first edge surface is provided in each side forming an outer periphery of the second substrate, and the first resin member is provided so as to contact the first edge surface provided in the each side.

12. The component according to claim 1, wherein the second substrate has a rectangular shape, and the first resin member is provided at at least one portion of each of four corners of the second substrate.

13. The component according to claim 1, wherein the second substrate has a rectangular shape, and the first resin member is provided at at least one portion on a straight line connecting a center of the second substrate and a middle point of each side of the second substrate.

14. The component according to claim 1, wherein the second substrate has a rectangular shape, and the first resin member is provided at at least one portion of each of four corners of the second substrate, and at least one portion on a straight line connecting a center of the second substrate and a middle point of each side of the second substrate.

15. The component according to claim 1, wherein the second substrate includes an upper surface on an opposite side of the lower surface, and a second edge surface provided between the upper surface and the side surface.

16. The component according to claim 15, wherein an angle of the second edge surface with respect to the upper surface is an obtuse angle.

17. The component according to claim 1, wherein the first substrate includes a non-overlapping region not overlapping the second substrate in an orthogonal projection with respect to the second substrate.

18. A display device comprising the electronic component according to claim 1, and an active element connected to the electronic component.

19. A photoelectric conversion device comprising an optical unit including a plurality of lenses, an image sensor configured to receive light having passed through the optical unit, and a display unit configured to display an image, wherein the display unit displays an image captured by the image sensor, and includes the electronic component according to claim 1.

20. An electronic apparatus comprising a housing provided with a display unit, and a communication unit provided in the housing and configured to perform external communication, wherein the display unit includes the electronic component according to claim 1.

21. An illumination device comprising a light source, and at least one of a light diffusing unit and an optical film, wherein the light source includes the electronic component according to claim 1.

22. A moving body comprising a main body, and a lighting appliance provided in the main body, wherein the lighting appliance includes the electronic component according to claim 1.

* * * * *